US012628709B2

(12) United States Patent　　　　(10) Patent No.:　US 12,628,709 B2
Kim et al.　　　　　　　　　　　　　(45) Date of Patent:　　May 12, 2026

(54) SEMICONDUCTOR PACKAGE HAVING TWO-DIMENSIONAL INPUT AND OUTPUT DEVICE

(71) Applicant: SAMSUNG ELECTRONICS CO., LTD., Suwon-si (KR)

(72) Inventors: Kyungsoo Kim, Suwon-si (KR); Kyenhee Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 716 days.

(21) Appl. No.: 17/979,480

(22) Filed: Nov. 2, 2022

(65) Prior Publication Data

US 2023/0223323 A1　　Jul. 13, 2023

(30) Foreign Application Priority Data

Jan. 10, 2022　(KR) ........................ 10-2022-0003622

(51) Int. Cl.
　H01L 23/498　　　(2006.01)
　H01L 23/00　　　(2006.01)
　　　　(Continued)
(52) U.S. Cl.
　CPC ...... H01L 23/49816 (2013.01); H01L 23/481 (2013.01); H01L 23/49844 (2013.01);
　　　　(Continued)
(58) Field of Classification Search
　CPC ..... H01L 25/50; H01L 25/0657; H01L 25/07; H01L 25/18; H01L 25/16;
　　　　(Continued)

(56) References Cited

U.S. PATENT DOCUMENTS

| | | | |
|---|---|---|---|
| 9,881,904 | B2 | 1/2018 | Das et al. |
| 10,229,897 | B2 | 3/2019 | Das |

(Continued)

FOREIGN PATENT DOCUMENTS

| | | |
|---|---|---|
| CN | 111758156 A | 10/2020 |
| KR | 10-2020-0037444 | 4/2020 |
| KR | 10-2020-0124693 | 3/2024 |

OTHER PUBLICATIONS

Office Action dated Sep. 9, 2025 issued by the Japanese Patent Office in Korean Patent Application No. 10-2022-0003622.

(Continued)

*Primary Examiner* — Lawrence C Tynes, Jr.

(74) *Attorney, Agent, or Firm* — Sughrue Mion, PLLC

(57)　　　　ABSTRACT

A semiconductor package is provided. The semiconductor package includes: a first semiconductor chip including a first bonding structure; a first front-end level layer including a first integrated circuit device; a first sub-back-end level layer including a plurality of first metal wire layers, an input and output device level layer including a two-dimensional input and output device, and a second sub-back-end level layer including a plurality of second metal wire layers electrically connected to the first integrated circuit device and the two-dimensional input and output device. The semiconductor package also includes a second semiconductor chip including a bonding structure that is bonded to the first (Continued)

bonding structure; a second front-end level layer including a second integrated circuit device, and a second back-end level layer including a plurality of third metal wire layers electrically connected to the second integrated circuit device.

20 Claims, 26 Drawing Sheets

(51) Int. Cl.
  *H01L 23/48*        (2006.01)
  *H01L 23/538*      (2006.01)
  *H01L 25/07*        (2006.01)
(52) U.S. Cl.
  CPC .......... *H01L 23/5384* (2013.01); *H01L 24/05* (2013.01); *H01L 24/16* (2013.01); *H01L 25/07* (2013.01); *H01L 2224/0401* (2013.01); *H01L 2224/05025* (2013.01); *H01L 2224/16146* (2013.01); *H01L 2924/15311* (2013.01)
(58) Field of Classification Search
  CPC . H01L 2224/02331; H01L 2224/05025; H01L 2224/0557; H01L 2224/02381; H01L 2225/06541; H01L 2225/06544; H01L 23/481; H01L 23/5384; H01L 23/5283; H01L 23/50; H01L 24/80
  See application file for complete search history.

(56)                References Cited

U.S. PATENT DOCUMENTS

| | | | |
|---|---|---|---|
| 10,354,980 | B1 | 7/2019 | Mushiga et al. |
| 10,803,548 | B2 | 10/2020 | Matam et al. |
| 10,803,941 | B2 | 10/2020 | Mazed |
| 10,943,869 | B2 | 3/2021 | Zhai et al. |
| 10,998,302 | B2 | 5/2021 | Elsherbini et al. |
| 11,041,211 | B2 | 6/2021 | Jain |
| 2010/0225002 | A1* | 9/2010 | Law ..................... H01L 23/481 |
| | | | 257/E21.597 |
| 2019/0164972 | A1 | 5/2019 | Peng et al. |
| 2020/0176420 | A1 | 6/2020 | Or-Bach et al. |
| 2020/0312839 | A1 | 10/2020 | Majhi et al. |
| 2021/0083122 | A1 | 3/2021 | Naylor et al. |

OTHER PUBLICATIONS

Office Action issued Mar. 20, 2026 from the Taiwanese Patent Office for Taiwan Patent Application No. 112100818.

* cited by examiner

SEMICONDUCTOR PACKAGE HAVING TWO-DIMENSIONAL INPUT AND OUTPUT DEVICE

CROSS-REFERENCE TO RELATED APPLICATION

This application claims priority to Korean Patent Application No. 10-2022-0003622, filed on Jan. 10, 2022, in the Korean Intellectual Property Office, the disclosure of which is incorporated by reference herein in its entirety.

BACKGROUND

The present disclosure relates to a semiconductor package, and more particularly, to a semiconductor package with optimized performance and reduced size.

As the amount of data to be processed by electronic devices increases, a semiconductor package with high capacity and high performance is required. In addition, in the semiconductor package, a total area of the package increases due to the increase in the number of integrated semiconductor chips, and the electrical connection between the semiconductor chips become complicated.

SUMMARY

The present disclosure provides a semiconductor package capable of optimizing performance thereof by facilitating an electrical connection between semiconductor chips while reducing a total area of the semiconductor package.

According to an aspect of an example embodiment, a semiconductor package includes: a first semiconductor chip including: a first bonding structure; a first front-end level layer provided on a first semiconductor substrate and including a first integrated circuit device; a first sub-back-end level layer provided on the first front-end level layer and including a plurality of first metal wire layers electrically connected to the first integrated circuit device; an input and output device level layer provided on the first sub-back-end level layer and including a two-dimensional input and output device; and a second sub-back-end level layer provided on the input and output device level layer and including a plurality of second metal wire layers electrically connected to the first integrated circuit device and the two-dimensional input and output device; and a second semiconductor chip including: a second bonding structure bonded to the first bonding structure of the first semiconductor chip; a second front-end level layer provided on a second semiconductor substrate and including a second integrated circuit device; and a second back-end level layer provided on the second front-end level layer and including a plurality of third metal wire layers electrically connected to the second integrated circuit device.

According to an aspect of an example embodiment, a semiconductor package includes: a first semiconductor substrate having a first surface and a second surface opposite to the first surface; a first front-end level layer provided on the first surface of the first semiconductor substrate and including a first integrated circuit device; a first sub-back-end level layer provided on the first front-end level layer and including a plurality of first metal wire layers electrically connected to the first integrated circuit device; an input and output device level layer provided on the first sub-back-end level layer and including a two-dimensional input and output device; a second sub-back-end level layer provided on the input and output device level layer and including a plurality of second metal wire layers electrically connected to the first integrated circuit device and the two-dimensional input and output device; a first through-via structure passing through all of the first sub-back-end level layer, the first front-end level layer, and the first semiconductor substrate, along a vertical direction from the input and output device level layer toward the first semiconductor substrate; a second semiconductor substrate having a third surface and a fourth surface opposite to the third surface, wherein the fourth surface is bonded to the second surface of the first semiconductor substrate; a second front-end level layer provided below the third surface of the second semiconductor substrate and including a second integrated circuit device; a second back-end level layer provided below the second front-end level layer and including a plurality of third metal wire layers electrically connected to the second integrated circuit device; and a second through-via structure bonded to the first through-via structure and passing through all of the second back-end level layer, the second front-end level layer, and the second semiconductor substrate along the vertical direction from the second back-end level layer toward the second semiconductor substrate.

According to an aspect of an example embodiment, a semiconductor package includes: a first semiconductor substrate having a first surface and a second surface opposite to the first surface; a first front-end level layer provided on the first surface of the first semiconductor substrate and including a first integrated circuit device; a first sub-back-end level layer provided on the first front-end level layer and including a plurality of first metal wire layers electrically connected to the first integrated circuit device; an input and output device level layer provided on the first sub-back-end level layer and including a two-dimensional input and output device; a second sub-back-end level layer provided on the input and output device level layer and including a plurality of second metal wire layers electrically connected to the first integrated circuit device and the two-dimensional input and output device; a through-via structure passing through all of the second sub-back-end level layer, the input and output device level layer, the first sub-back-end level layer, the first front-end level layer, and the first semiconductor substrate along a vertical direction from the second sub-back-end level layer toward the first semiconductor substrate; a first bump level layer provided on the second sub-back-end level layer and the through-via structure and including a first internal bump; a second semiconductor substrate having a third surface and a fourth surface opposite to the third surface; a second front-end level layer provided below the third surface of the second semiconductor substrate and including a second integrated circuit device; a second back-end level layer provided below the second front-end level layer and including a plurality of third metal wire layers electrically connected to the second integrated circuit device; and a second bump level layer provided below the second back-end level layer and including a second internal bump electrically connected to the plurality of third metal wire layers, wherein the second internal bump is bonded to the first internal bump.

BRIEF DESCRIPTION OF THE DRAWINGS

The above and other aspects and features will be more apparent from the following description of example embodiments, taken in conjunction with the accompanying drawings, in which:

FIGS. 21 to 23 are cross-sectional views illustrating a method of manufacturing the semiconductor package of FIG. 17 according to an example embodiment;

DETAILED DESCRIPTION

Hereinafter, example embodiments will be described in detail with reference to the accompanying drawings. Each example embodiment is not excluded from being associated with one or more features of another example or another example embodiment also provided herein or not provided herein but consistent with the present disclosure.

As used herein, the singular forms "a", "an" and "the" of components are intended to include the plural forms as well, unless the context clearly indicates otherwise. In the present specification, the drawings are exaggerated in order to more clearly explain the inventive concept. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
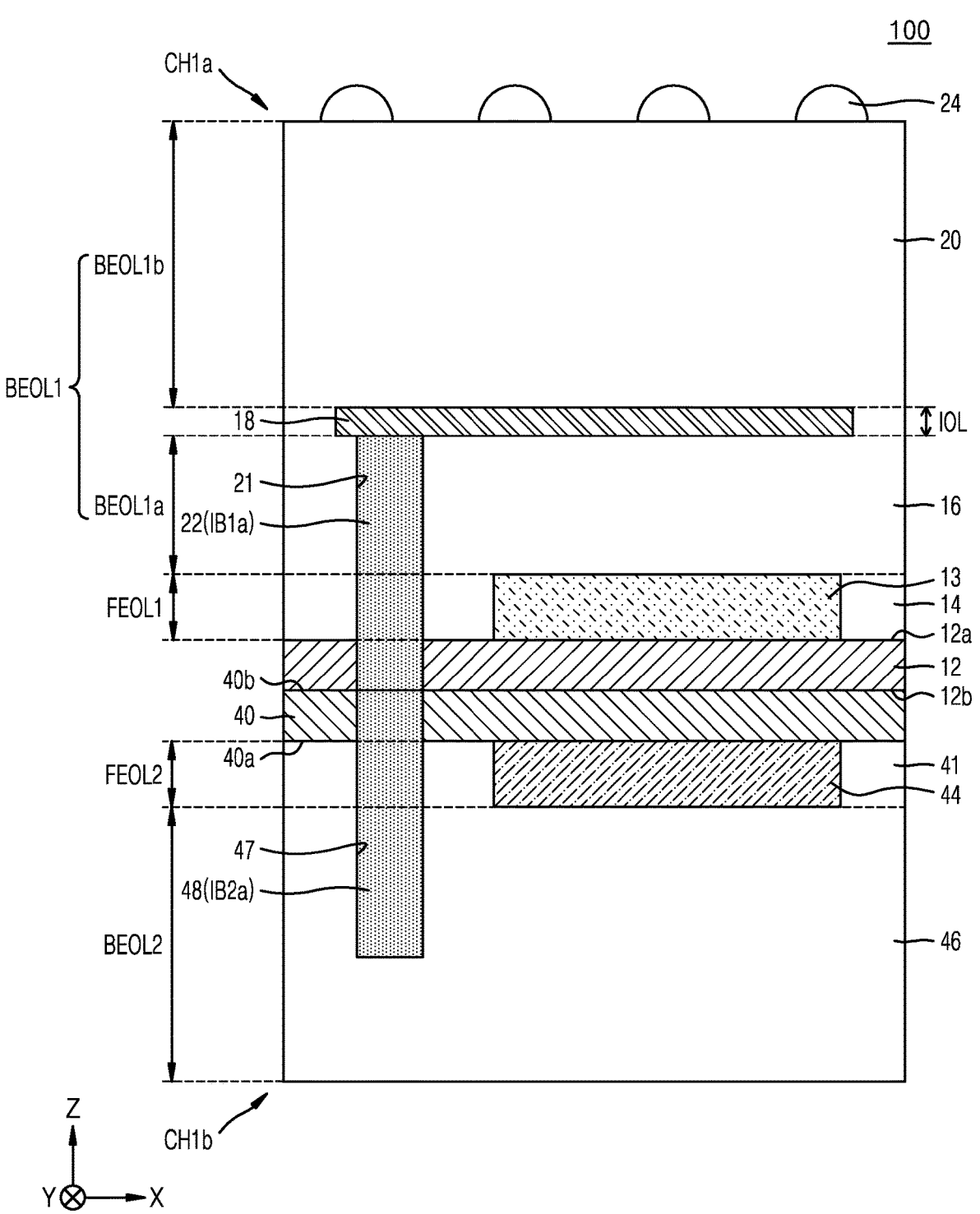
FIG. 1 is a conceptual cross-sectional view of a semiconductor package according to an example embodiment.

FIG. 1 is a conceptual cross-sectional view of a semiconductor package 100 according to an example embodiment.

In particular, the semiconductor package 100 may be formed by bonding a first semiconductor chip CH1*a* to a second semiconductor chip CH1*b*. The first semiconductor chip CH1*a* includes a first semiconductor substrate 12 having a first surface 12*a* and a second surface 12*b* opposite to the first surface 12*a*. A first integrated circuit device 13 and a first interlayer insulating layer 14 may be formed on the first surface 12*a* of the first semiconductor substrate 12.

The first interlayer insulating layer 14 may insulate the first integrated circuit device 13. As shown in FIG. 1, X and Y directions may be directions horizontal to the first surface 12*a* of the first semiconductor substrate 12, and a Z direction may be a direction perpendicular to the first surface 12*a* of the first semiconductor substrate 12.

The first semiconductor substrate 12 may be a silicon substrate. The first surface 12*a* may be a front surface, and the second surface 12*b* may be a rear surface. The first integrated circuit device 13 may be a master device. The first integrated circuit device 13 may also be referred to as a first integrated circuit layer. The first integrated circuit device 13 may be a processing device or a logic device. The first integrated circuit device 13 may include a plurality of transistors.

The first integrated circuit device 13 and the first interlayer insulating layer 14, which are formed on the first surface 12*a* of the first semiconductor substrate 12, may configure a first front-end level layer FEOL1. The first front-end level layer FEOL1 may be a structure formed at a front end of line in a viewpoint of a manufacturing operation.

A first sub-back-end level layer BEOL1*a* may be formed on the first front-end level layer FEOL1. The first sub-back-end level layer BEOL1*a* may include a first metal wire structure 16 electrically connected to the first integrated circuit device 13. The first metal wire structure 16 may include a plurality of first metal wire layers, as described below.

An input and output device level layer IOL may be formed on the first sub-back-end level layer BEOL1*a*. The input and output device level layer IOL may include a two-dimensional input and output device 18. The two-dimensional input and output device 18 may include a plurality of transistors. The two-dimensional input and output device 18 including a two-dimensional channel layer is described below in more detail.

The first semiconductor chip CH1a may include a first via hole 21 passing through the first sub-back-end level layer BEOL1a, the first front-end level layer FEOL1, and the first semiconductor substrate 12 in a direction from the two-dimensional input and output device 18 toward the first semiconductor substrate 12 (i.e., the Z direction), and a first through-via structure 22 formed in the first via hole 21. The first through-via structure 22 may include a first via insulating liner layer formed in the first via hole 21 and a first via electrode layer formed on the first via insulating liner layer.

The first through-via structure 22 may be a first through-silicon-via (TSV) structure. The first through-via structure 22 may be a via structure for signal transmission or a via structure for power transmission. The first through-via structure 22 may be electrically connected to the two-dimensional input and output device 18 and the first metal wire layers configuring the first metal wire structure 16. The first through-via structure 22 may configure a first bonding member IB1a.

A second sub-back-end level layer BEOL1b may be formed on the input and output device level layer IOL. The second sub-back-end level layer BEOL1b may include a second metal wire structure 20 electrically connected to the first integrated circuit device 13 and the two-dimensional input and output device 18. The second metal wire structure 20 may include a plurality of second metal wire layers, as described below.

The input and output device level layer IOL may be between the first sub-back-end level layer BEOL1a and the second sub-back-end level layer BEOL1b. The two-dimensional input and output device 18 included in the input and output device level layer IOL may be between the first sub-back-end level layer BEOL1a and the second sub-back-end level layer BEOL1b.

The first sub-back-end level layer BEOL1a and the second sub-back-end level layer BEOL1b may be referred to as a first back-end level layer BEOL1. The first back-end level layer BEOL1 may be a structure manufactured at a back end of line in a viewpoint of a manufacturing operation. An external bump 24 electrically connected to the second metal wire structure 20 may be formed on the second sub-back-end level layer BEOL1b.

The second semiconductor chip CH1b may include a second semiconductor substrate 40 having a third surface 40a and a fourth surface 40b opposite to the third surface 40a. A second integrated circuit device 44 and a second interlayer insulating layer 41 may be formed below the third surface 40a or on the third surface 40a of the second semiconductor substrate 40.

As shown in FIG. 1, the X and Y directions may be horizontal to the third surface 40a of the second semiconductor substrate 40, and the Z direction may be perpendicular to the third surface 40a of the second semiconductor substrate 40. The second interlayer insulating layer 41 may insulate the second integrated circuit device 44. The second integrated circuit device 44 and the second interlayer insulating layer 41 may be arranged below the second semiconductor substrate 40.

The second semiconductor substrate 40 may be a silicon substrate. The third surface 40a may be a front surface, and the fourth surface 40b may be a rear surface. The second integrated circuit device 44 may be a different type (heterogeneous) of device from the first integrated circuit device 13.

The second integrated circuit device 44 may be a slave device. The second integrated circuit device 44 may include a plurality of transistors.

The second integrated circuit device 44 may also be referred to as a second integrated circuit layer. The second integrated circuit device 44 may be a device having a lower operating speed than that of the first integrated circuit device 13. The second integrated circuit device 44 may be a processing device or a logic device.

The second integrated circuit device 44 and the second interlayer insulating layer 41, which are formed on the third surface 40a of the second semiconductor substrate 40, may configure a second front-end level layer FEOL2. The second front-end level layer FEOL2 may be a structure formed at a front end of line in a viewpoint of a manufacturing operation.

A second back-end level layer BEOL2 may be formed on the second front-end level layer FEOL2. The second back-end level layer BEOL2 may include a third metal wire structure 46 electrically connected to the second integrated circuit device 44. The third metal wire structure 46 may include a plurality of third metal wire layers, as described below.

The second semiconductor chip CH1b may include a second via hole 47 passing through the second back-end level layer BEOL2, the second front-end level layer FEOL2, and the second semiconductor substrate 40 in a direction from the second back-end level layer BEOL2 toward the second semiconductor substrate 40 (i.e., the Z direction), and a second through-via structure 48 formed in the second via hole 47. The second through-via structure 48 may include a second via insulating liner layer formed in the second via hole 47 and a second via electrode layer formed on the second via insulating liner layer.

The second through-via structure 48 may be a second TSV structure. The second through-via structure 48 may be a via structure for signal transmission or a via structure for power transmission. The second through-via structure 48 may be electrically connected to the third metal wire layers configuring the third metal wire structure 46. The second through-via structure 48 may configure a second bonding member IB2a.

In some example embodiments, a ratio of the transistors included in the first integrated circuit device 13, the transistors included in the two-dimensional input and output device 18, and the transistors included in the second integrated circuit device 44 may be 55:40:5. In some example embodiments, the ratio described above may be adjusted within a ratio of ±10%.

The semiconductor package 100 may be formed by bonding the second bonding member IB2a configured by the second through-via structure 48 to the first bonding member IB1a configured by the first through-via structure 22. The second surface 12b of the first semiconductor substrate 12 may be in contact with the fourth surface 40b of the second semiconductor substrate 40.

The semiconductor package 100 may include the first semiconductor chip CH1a and the second semiconductor chip CH1b. The two-dimensional input and output device 18 may be embedded in the first semiconductor chip CH1a, and the first semiconductor chip CH1a may be provided on the first integrated circuit device 13. The second semiconductor chip CH1b may include the second integrated circuit device 44, and may be bonded to the first semiconductor chip CH1a.

Accordingly, in the semiconductor package 100, the two-dimensional input and output device 18 is vertically stacked on the first semiconductor substrate 12, and thus, a total area of the semiconductor package 100 may be reduced. Because the semiconductor package 100 may be formed by stacking the first semiconductor chip CH1a and the second semiconductor chip CH1b, and the second bonding member IB2a configured by the second through-via structure 48 and the first bonding member IB1a configured by the first through-via structure 22 are directly bonded and connected, the performance of the semiconductor package 100 may be optimized by facilitating an electrical connection between the first semiconductor chip CH1a and the second semiconductor chip CH1b.

Figure 2:
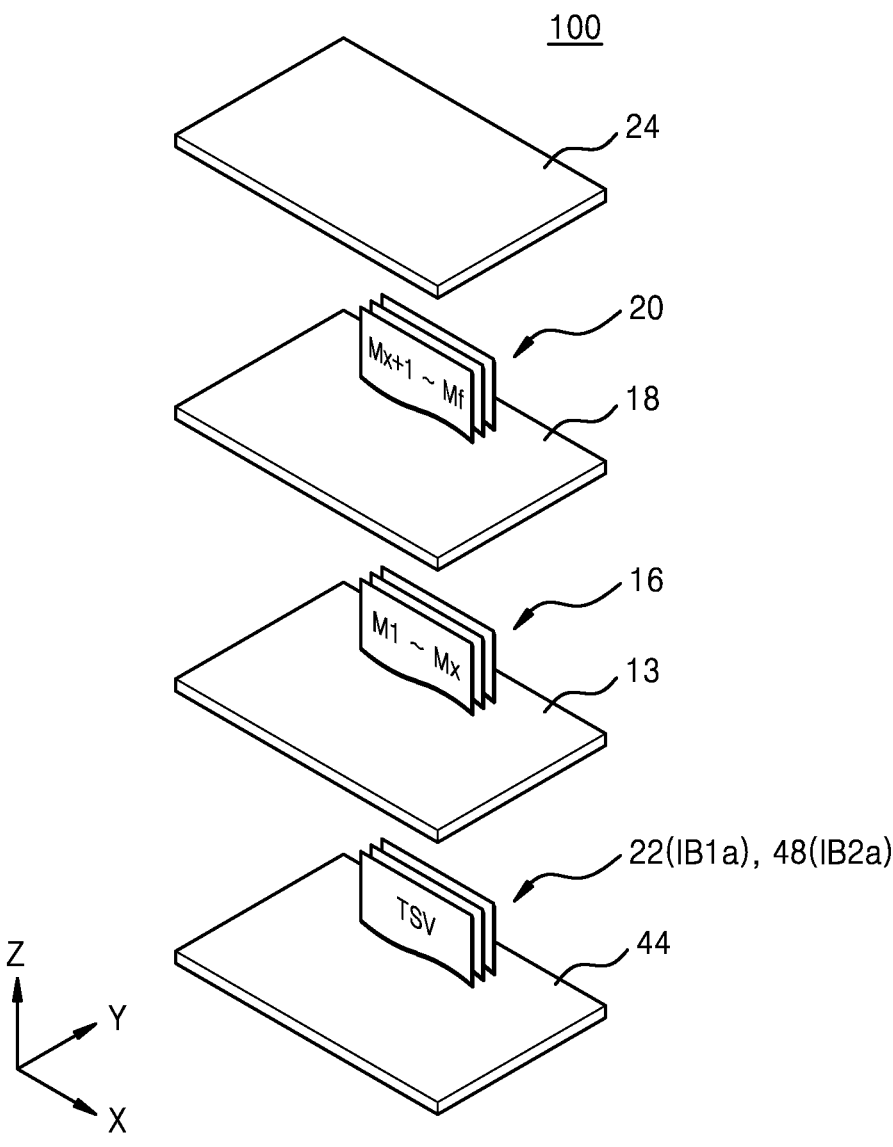
FIG. 2 is a diagram for explaining an arrangement and connection relationship between components of the semiconductor package of FIG. 1 according to an example embodiment.

FIG. 2 is a diagram for explaining an arrangement and connection relationship between components of the semiconductor package 100 of FIG. 1.

In particular, in the semiconductor package 100, the second integrated circuit device 44 may be positioned lowermost. The second integrated circuit device 44 may be electrically connected to the first integrated circuit device 13 by using the first bonding member IB1a configured by the first through-via structure 22 and the second bonding member IB2a configured by the second through-via structure 48.

The first metal wire structure 16 may be on the first integrated circuit device 13. The first metal wire structure 16 may include a plurality of first metal wire layers M1 to Mx. The plurality of first metal wire layers M1 to Mx may include a first metal layer M1 to an x-th metal layer Mx (where x is a positive integer).

The two-dimensional input and output device 18 may be on the first metal wire structure 16. The second metal wire structure 20 may be on the two-dimensional input and output device 18. The second metal wire structure 20 may include a plurality of second metal wire layers Mx+1 to Mf. The plurality of second metal wire layers Mx+1 to Mf may include an x+1-th metal layer Mx+1 to an f-th metal layer Mf (where x and f are positive integers). A pitch of metal patterns of the plurality of second metal wire layers Mx+1 to Mf may be greater than that of the plurality of first metal wire layers M1 to Mx.

The two-dimensional input and output device 18 may be between the first metal wire structure 16 and the second metal wire structure 20. In some example embodiments, f may be 14, and x may be 3, 4, 5, 6 or 7.

In other words, when the first metal wire structure 16 and the second metal wire structure 20 are configured by fourteen metal wire layers, the two-dimensional input and output device 18 may be on three, four, five, six or seven metal layers. The external bump 24 electrically connected to the second metal wire structure 20 may be formed on the second metal wire structure 20.

Figure 3:
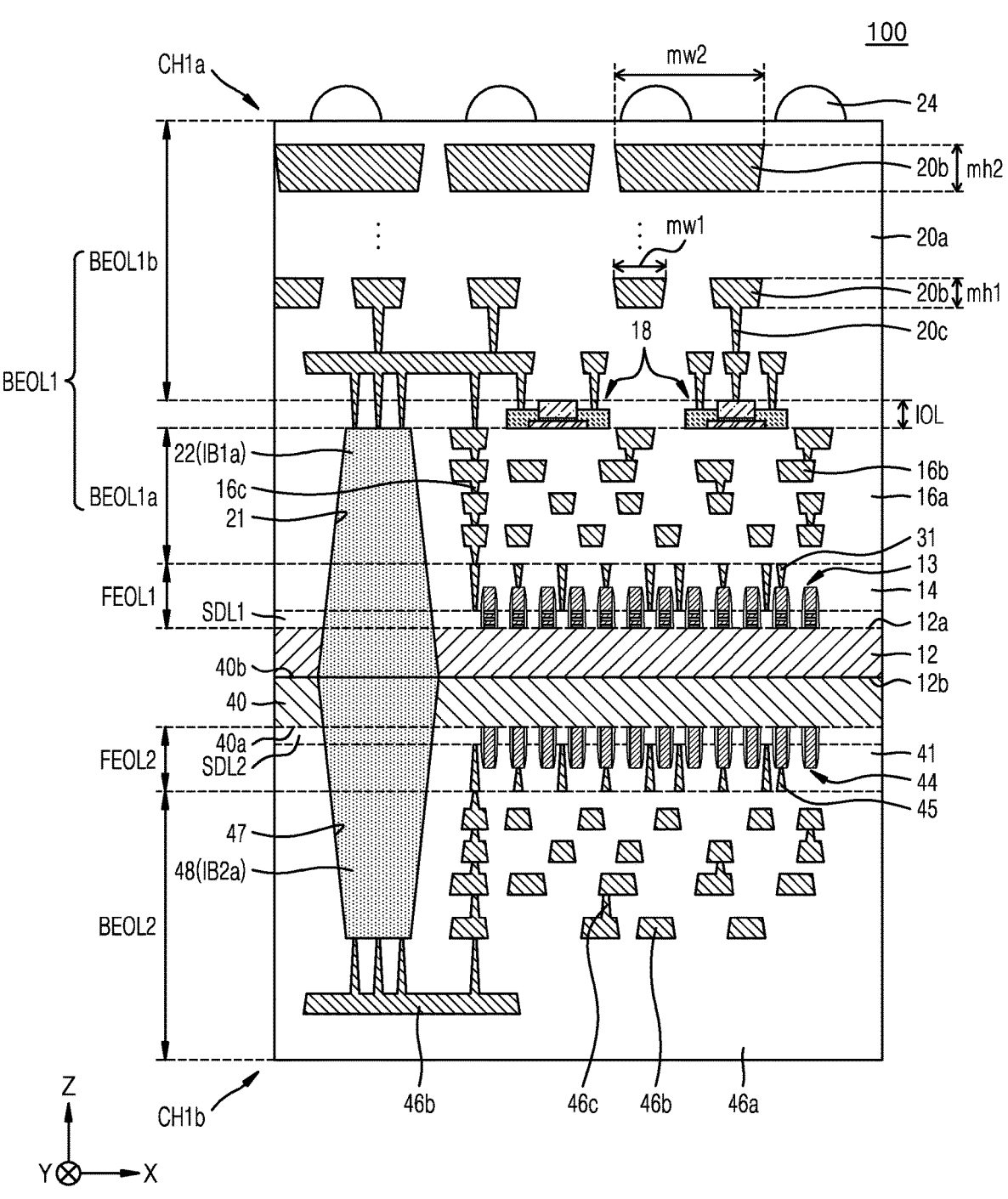
FIG. 3 is a cross-sectional view of a semiconductor package according to an example embodiment.

FIG. 3 is a cross-sectional view of the semiconductor package 100 according to an example embodiment.

In particular, FIG. 3 illustrates an example embodiment in which the semiconductor package 100 of FIG. 1 is implemented. In FIG. 3, the same reference numerals as in FIG. 1 denote the same members. In the description of FIG. 3, description previously given with respect to FIG. 1 is briefly given or omitted.

The semiconductor package 100 may be configured by bonding the first semiconductor chip CH1a to the second semiconductor chip CH1b. In the first semiconductor chip CH1a, the first front-end level layer FEOL1 may be formed on the first surface 12a of the first semiconductor substrate 12. The first front-end level layer FEOL1 may include the first integrated circuit device 13, the first interlayer insulating layer 14, and a first contact plug 31. The first integrated circuit device 13 may include a first source and drain level SDL1.

The first integrated circuit device 13 may be a master device. In some example embodiments, the first integrated circuit device 13 may be a processing device or a logic device. In some example embodiments, the first integrated circuit device 13 may include a multi-bridge channel transistor. The first integrated circuit device 13 is described below in more detail.

The first sub-back-end level layer BEOL1a electrically connected to the first front-end level layer FEOL1 through the first contact plug 31 may be formed on the first front-end level layer FEOL1. The first sub-back-end level layer BEOL1a may include a first metal wire structure (16 in FIG. 1) electrically connected to the first integrated circuit device 13. The first metal wire structure 16 may include a plurality of first metal wire layers 16b and first metal vias 16c, which are formed in a first metal wire insulating layer 16a. The first metal vias 16c may be formed between the plurality of first metal wire layers 16b to electrically connect the plurality of first metal wire layers 16b to each other.

The input and output device level layer IOL may be formed on the first sub-back-end level layer BEOL1a. The input and output device level layer IOL may include the two-dimensional input and output device 18. The two-dimensional input and output device 18 including a two-dimensional channel layer is described below in more detail.

The first semiconductor chip CH1a may include the first via hole 21 passing through the first sub-back-end level layer BEOL1a, the first front-end level layer FEOL1, and the first semiconductor substrate 12, and the first through-via structure 22 formed in the first via hole 21. The first through-via structure 22 may be electrically connected to the two-dimensional input and output device 18 and the plurality of first metal wire layers 16b. The first through-via structure 22 may configure the first bonding member IB1a.

The second sub-back-end level layer BEOL1b may be formed on the input and output device level layer IOL. The second sub-back-end level layer BEOL1b may include a second metal wire structure (20 of FIG. 1) electrically connected to the first integrated circuit device 13 and the two-dimensional input and output device 18. The second metal wire structure 20 may include a plurality of second metal wire layers 20b and second metal vias 20c, which are formed in a second metal wire insulating layer 20a. A second metal wire layer 20b formed at a middle portion of the plurality of second metal wire layers 20b may have a first width mw1 and a first height mh1. A second metal wire layer 20b formed at an upper portion (or an uppermost portion) of the plurality of second metal wire layers 20b may have a second width mw2 and a second height mh2. The second width mw2 and the second height mh2 may respectively be greater than the first width mw1 and the first height mh1. The second metal vias 20c may be formed between the plurality of second metal wire layers 20b to electrically connect the plurality of second metal wire layers 20b to each other.

The input and output device level layer IOL may be positioned at a central portion of the first back-end level layer BEOL1, that is, between the first sub-back-end level layer BEOL1a and the second sub-back-end level layer BEOL1b. The two-dimensional input and output device 18 included in the input and output device level layer IOL may be between the first sub-back-end level layer BEOL1a and the second sub-back-end level layer BEOL1b. The external bump 24 electrically connected to the plurality of second metal wire layers 20b may be formed on the second sub-back-end level layer BEOL1b.

In the second semiconductor chip CH1b, the second front-end level layer FEOL2 may be formed below the third surface 40a of the second semiconductor substrate 40. The second front-end level layer FEOL2 may include the second interlayer insulating layer 41, the second integrated circuit device 44, and a second contact plug 45. The second interlayer insulating layer 41 and the second integrated circuit device 44 may be arranged below the second semi-conductor substrate 40. The second integrated circuit device 44 may include a second source and drain level SDL2.

The second integrated circuit device 44 may be a slave device. The second integrated circuit device 44 may be a device having a lower operating speed than that of the first integrated circuit device 13. The second integrated circuit device 44 may be a processing device or a logic device. In some example embodiments, the second integrated circuit device 44 may include a fin field-effect transistor (FinFET) transistor. The second integrated circuit device 44 is described below in more detail.

The second back-end level layer BEOL2 electrically connected to the second front-end level layer FEOL2 through the second contact plug 45 may be formed on the second front-end level layer FEOL2. The second back-end level layer BEOL2 may include a third metal wire structure (46 of FIG. 1) electrically connected to the second integrated circuit device 44. The third metal wire structure 46 may include a plurality of third metal wire layers 46b and third metal vias 46c, which are formed in a third metal wire insulating layer 46a. The third metal vias 46c may be formed between the plurality of third metal wire layers 46b to electrically connect the plurality of third metal wire layers 46b to each other.

The second semiconductor chip CH1b may include the second via hole 47 passing through a portion of the second back-end level layer BEOL2, the second front-end level layer FEOL2, and the second semiconductor substrate 40, and the second through-via structure 48 formed in the second via hole 47. The second through-via structure 48 may be electrically connected to the plurality of third metal wire layers 46b. The second through-via structure 48 may configure the second bonding member IB2a.

In the semiconductor package 100, because the two-dimensional input and output device 18 is vertically stacked on the first semiconductor substrate 12, the performance of the semiconductor package 100 may be optimized by reducing a total area of the semiconductor package 100 and facilitating an electrical connection between the first semiconductor chip CH1a and the second semiconductor chip CH1b.

Figure 4:
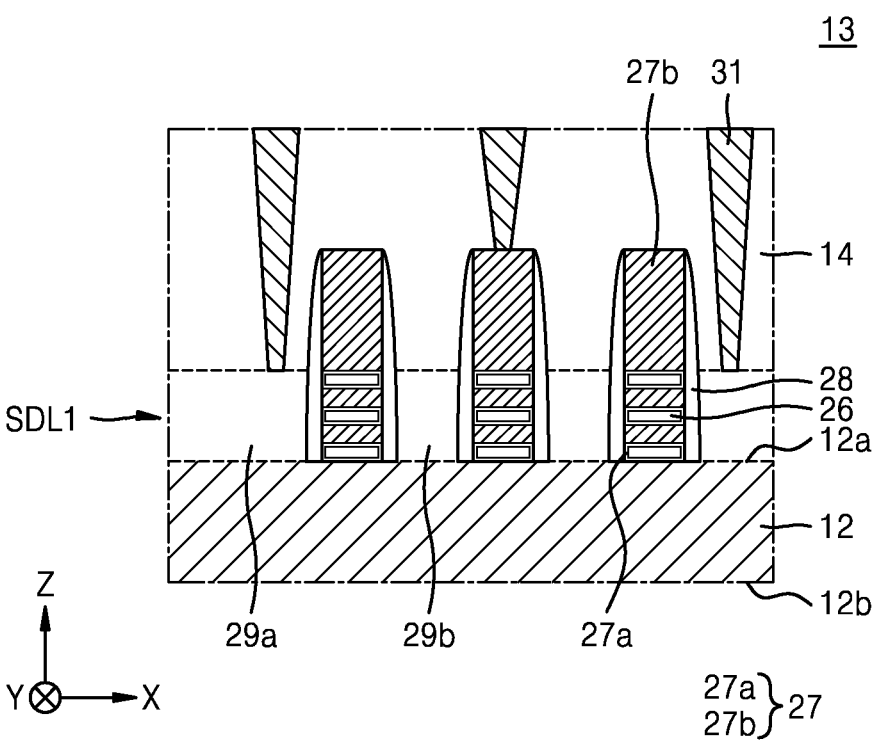
FIG. 4 is an enlarged cross-sectional view of a first integrated circuit device of the semiconductor package of FIG. 3 according to an example embodiment.

FIG. 4 is an enlarged cross-sectional view of the first integrated circuit device 13 of the semiconductor package 100 of FIG. 3.

In particular, the first integrated circuit device 13 may include a multi-bridge channel transistor. The first integrated circuit device 13 may be implemented on the first semiconductor substrate 12. The first integrated circuit device 13 may include a nano-sheet structure 26 formed on the first surface 12a of the first semiconductor substrate 12.

The first integrated circuit device 13 may include a gate structure 27 surrounding the nano-sheet structure 26, and gate spacers 28 formed on both sidewalls of the gate structure 27. The gate structure 27 may include a gate insulating layer 27a and a gate electrode 27b.

In addition, the first integrated circuit device 13 may include first source and drain areas 29a and 29b formed on the first semiconductor substrate 12 and between the gate spacers 28. The first source and drain areas 29a and 29b configure the first source and drain level SDL1 on the first surface 12a of the first semiconductor substrate 12. The first source and drain areas 29a and 29b may be electrically connected to the first contact plug 31.

Figure 5:
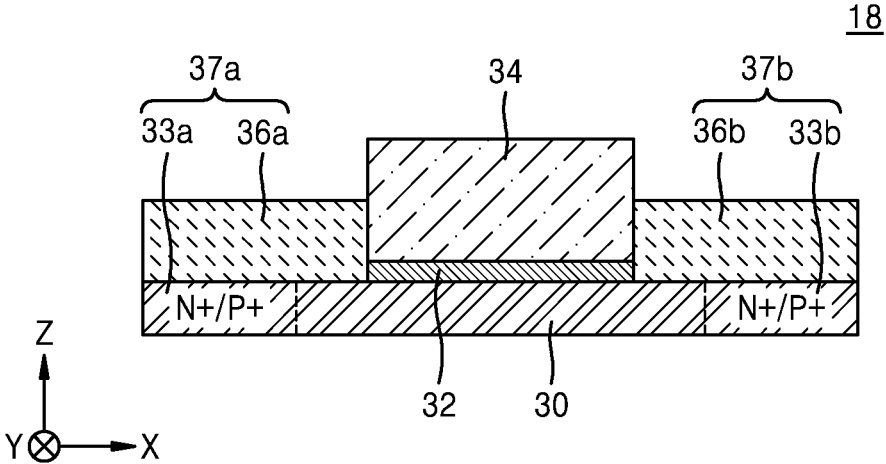
FIG. 5 is an enlarged cross-sectional view of a two-dimensional input and output device of the semiconductor package of FIG. 3 according to an example embodiment.

FIG. 5 is an enlarged cross-sectional view of the two-dimensional input and output device 18 of the semiconductor package 100 of FIG. 3.

In particular, the two-dimensional input and output device 18 may include a two-dimensional channel layer 30 formed on a first metal wire insulating layer (16a of FIG. 3). The two-dimensional channel layer 30 may be configured by a transition metal di-chalcogenide compound or black phosphorus. The transition metal di-chalcogenide compound may include at least one of $MoS_2$, $WTe_2$, $WSe_2$, $ReS_2$, $MoTe_2$, $MoSe_2$, $SnS_2$, $ReSe_2$, $HfSe_2$, and $HfS_2$.

The two-dimensional channel layer 30 may have semiconductor characteristics. The two-dimensional channel layer 30 may be a two-dimensional material without deterioration of electrical mobility in a monolayer scale. The two-dimensional material may be a material in which atoms have an atomic layer thickness, for example, several nm, and form a crystal structure in a plane. With respect to the two-dimensional material, crystalline compounds may be classified into zero-dimensional (0D), one-dimensional (1D), two-dimensional (2D), and three-dimensional (3D) materials according to the dimension of a structure thereof. Even when a material is formed by the same element, when the dimensions thereof are different, a bonding characteristic between atoms varies, and thus, physical characteristics, such as electrical mobility and mechanical strength, may vary.

The two-dimensional input and output device 18 may include a gate insulating layer 32 and a gate electrode 34 which form a gate structure.

In some example embodiments, the gate insulating layer 32 (or a gate dielectric layer) may include an oxide material, for example, a metal oxide, a silicon oxide, or the like. In some example embodiments, the gate electrode 34 may include a metal material, for example, gold, copper, aluminum, or the like.

The two-dimensional input and output device 18 may include a source structure 37a and a drain structure 37b formed on the two-dimensional channel layer 30 and respectively on both sides of the gate insulating layer 32 and the gate electrode 34. The source structure 37a may include a source dopant layer 33a and a source semimetal layer 36a, which are formed on the two-dimensional channel layer 30 and on one side of the gate insulating layer 32 and the gate electrode 34.

The drain structure 37b may include a drain dopant layer 33b and a drain semimetal layer 36b, which are formed on the two-dimensional channel layer 30 and on the other side of the gate insulating layer 32 and the gate electrode 34.

The source dopant layer 33a and the drain dopant layer 33b may be formed by doping the two-dimensional channel layer 30 with impurities. In some example embodiments, the source dopant layer 33a and the drain dopant layer 33b may each be an N+ dopant layer. In some example embodiments, the source dopant layer 33a and the drain dopant layer 33b may each be a P+ dopant layer. In some example embodiments, the source semimetal layer 36a and the drain semimetal layer 36b may each include a metal, for example, bismuth (Bi).

The source dopant layer 33a and the drain dopant layer 33b may implement an ohmic contact respectively with the source semimetal layer 36*a* and the drain semimetal layer 36*b* to reduce contact resistance.

Figure 6:
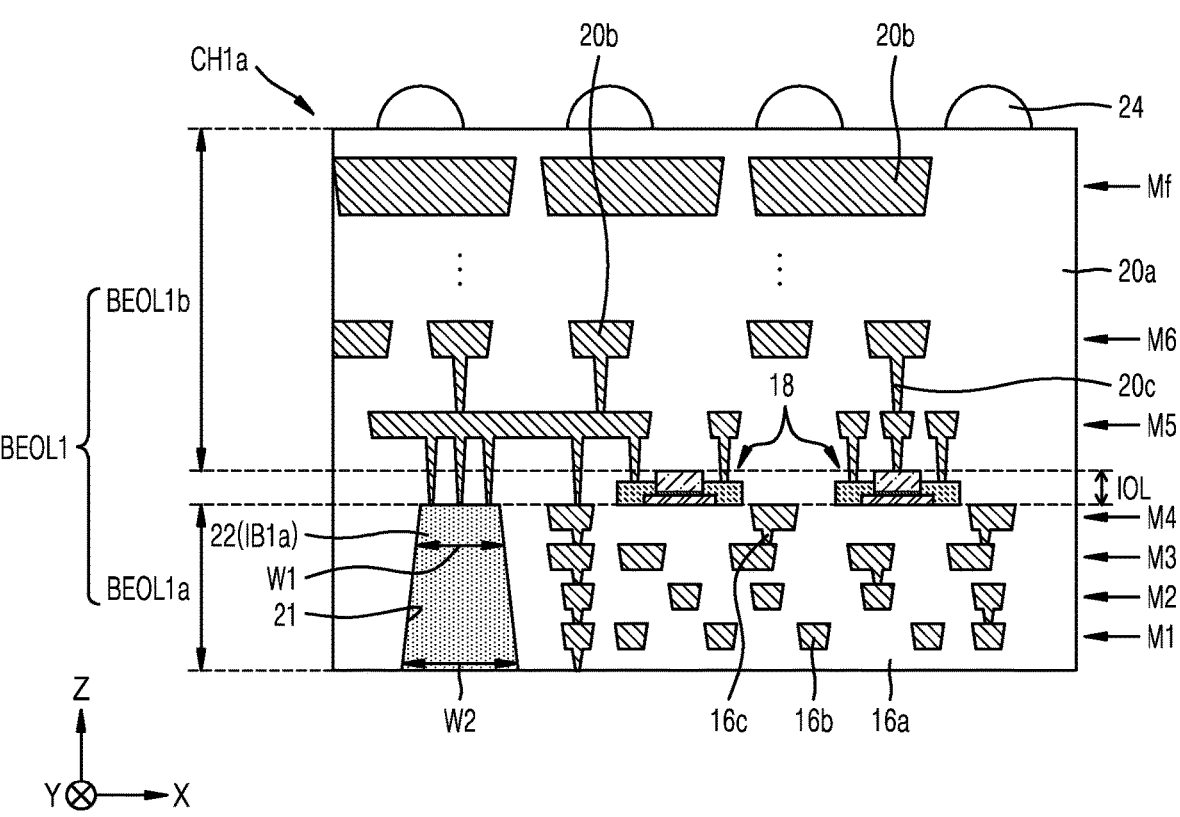
FIG. 6 is an enlarged cross-sectional view of a first back-end level layer and an input and output device level layer of a first semiconductor chip of the semiconductor package of FIG. 3 according to an example embodiment.

FIG. 6 is an enlarged cross-sectional view of a first back-end level layer BEOL1 and the input and output device level layer IOL of the first semiconductor chip CH1*a* of the semiconductor package 100 of FIG. 3.

In the description of FIG. 6, description previously given with respect to FIG. 3 is briefly given or omitted. The first back-end level layer BEOL1 of the first semiconductor chip CH1*a* may include the first sub-back-end level layer BEOL1*a* and the second sub-back-end level layer BEOL1*b*.

The first sub-back-end level layer BEOL1*a* may include the plurality of first metal wire layers 16*b* and the first metal vias 16*c*, which are formed in the first metal wire insulating layer 16*a*. In some example embodiments, the plurality of first metal wire layers 16*b* may include four metal layers, that is, a first metal layer M1, a second metal layer M2, a third metal layer M3, and a fourth metal layer M4. In the first through-via structure 22 included in the first sub-back-end level layer BEOL1*a*, an upper width W1 thereof may be less than a lower width W2 thereof.

The second sub-back-end level layer BEOL1*b* may include the plurality of second metal wire layers 20*b* and the second metal vias 20*c*, which are formed in the second metal wire insulating layer 20*a*. In some example embodiments, the plurality of second metal wire layers 20*b* may include f-4 (where f is a positive integer) metal layers, that is, a fifth metal layer M5, a sixth metal layer M5, and an f-th metal layer Mf.

The input and output device level layer IOL may be positioned at a central portion of the first back-end level layer BEOL1, that is, between the fourth metal layer M4 of the first sub-back-end level layer BEOL1*a* and the fifth metal layer M5 of the second sub-back-end level layer BEOL1*b*. In some example embodiments, the plurality of first metal wire layers 16*b* and the plurality of second metal wire layers 20*b* may include up to twenty metal layers. That is, in the f-th metal layer Mf, f may be equal to or less than 20.

Figure 7:
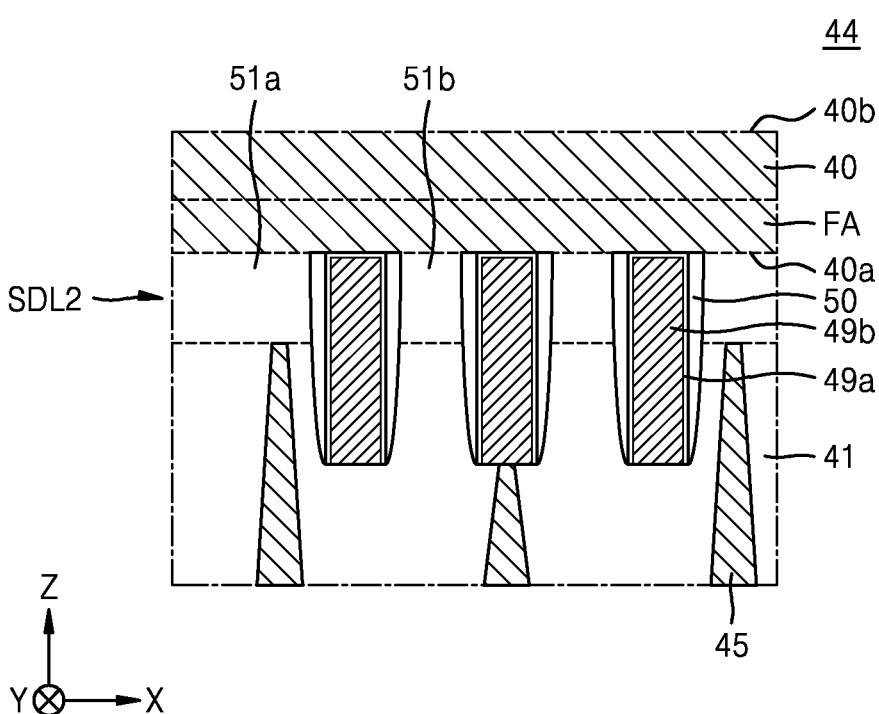
FIG. 7 is an enlarged cross-sectional view of a second integrated circuit device of the semiconductor package of FIG. 3 according to an example embodiment.

FIG. 7 is an enlarged cross-sectional view of the second integrated circuit device 44 of the semiconductor package 100 of FIG. 3.

In particular, the second integrated circuit device 44 may include a FinFET transistor. The second integrated circuit device 44 may be implemented on the second semiconductor substrate 40. The second integrated circuit device 44 may include a fin-type active area FA formed on the third surface 40*a* of the second semiconductor substrate 40.

The second integrated circuit device 44 may include a gate insulating layer 49*a* and a gate electrode 49*b* which form a gate structure on the fin-type active area FA, and gate spacers 50 formed on both sidewalls of the gate insulating layer 49*a* and the gate electrode 49*b*.

In addition, the second integrated circuit device 44 may include second source and drain areas 51*a* and 51*b* formed on the second semiconductor substrate 40 and between the gate spacers 50. The second source and drain areas 51*a* and 51*b* configure the second source and drain level SDL2 on the third surface 40*a* of the second semiconductor substrate 40. The second source and drain areas 51*a* and 51*b* may be electrically connected to the second contact plug 45.

Figure 8:
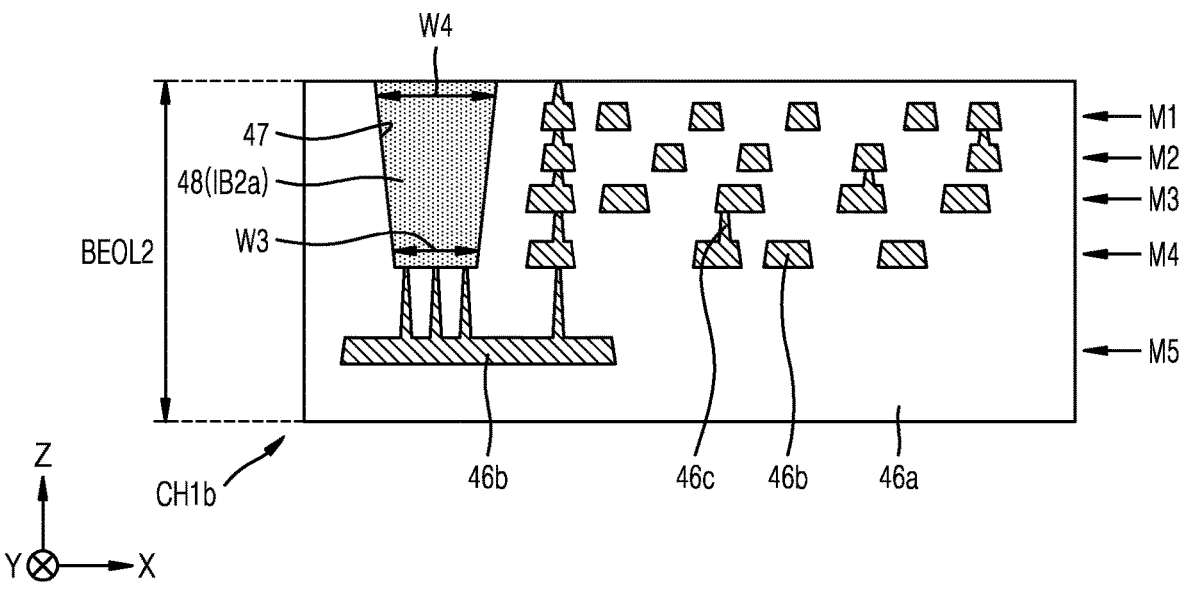
FIG. 8 is an enlarged cross-sectional view of a second back-end level layer of a second semiconductor chip of the semiconductor package of FIG. 3 according to an example embodiment.

FIG. 8 is an enlarged cross-sectional view of the second back-end level layer BEOL2 of the second semiconductor chip CH1*b* of the semiconductor package 100 of FIG. 3.

In the description of FIG. 8, description previously given with respect to FIG. 3 is briefly given or omitted. The second back-end level layer BEOL2 of the second semiconductor chip CH1*b* may include the plurality of third metal wire layers 46*b* and the third metal vias 46*c*, which are formed in the third metal wire insulating layer 46*a*.

In some example embodiments, the plurality of third metal wire layers 46*b* may include five metal layers, that is, a first metal layer M1, a second metal layer M2, a third metal layer M3, a fourth metal layer M4, and a fifth metal layer M5. The number of third metal wire layers 46*b* may be less than the number of first and second metal wire layers 16*b* and 20*b* described above with reference to FIG. 6.

Although five metal wire layers are shown in FIG. 5, the plurality of third metal wire layers 46*b* may include up to ten metal wire layers. In the second through-via structure 48 included in the second back-end level layer BEOL2, an upper width W4 thereof may be greater than a lower width W3 thereof.

Figure 9:
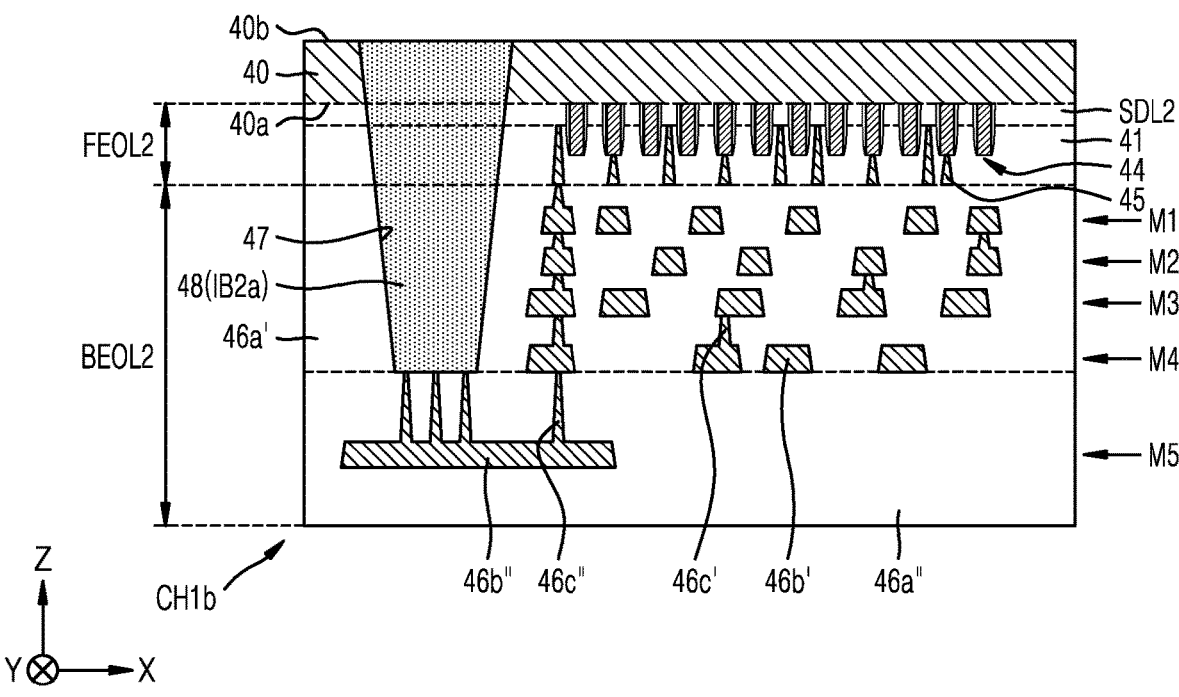
FIGS. 9 to 11 are cross-sectional views illustrating a method of manufacturing the semiconductor package of FIG. 3 according to an example embodiment.
Figure 10:
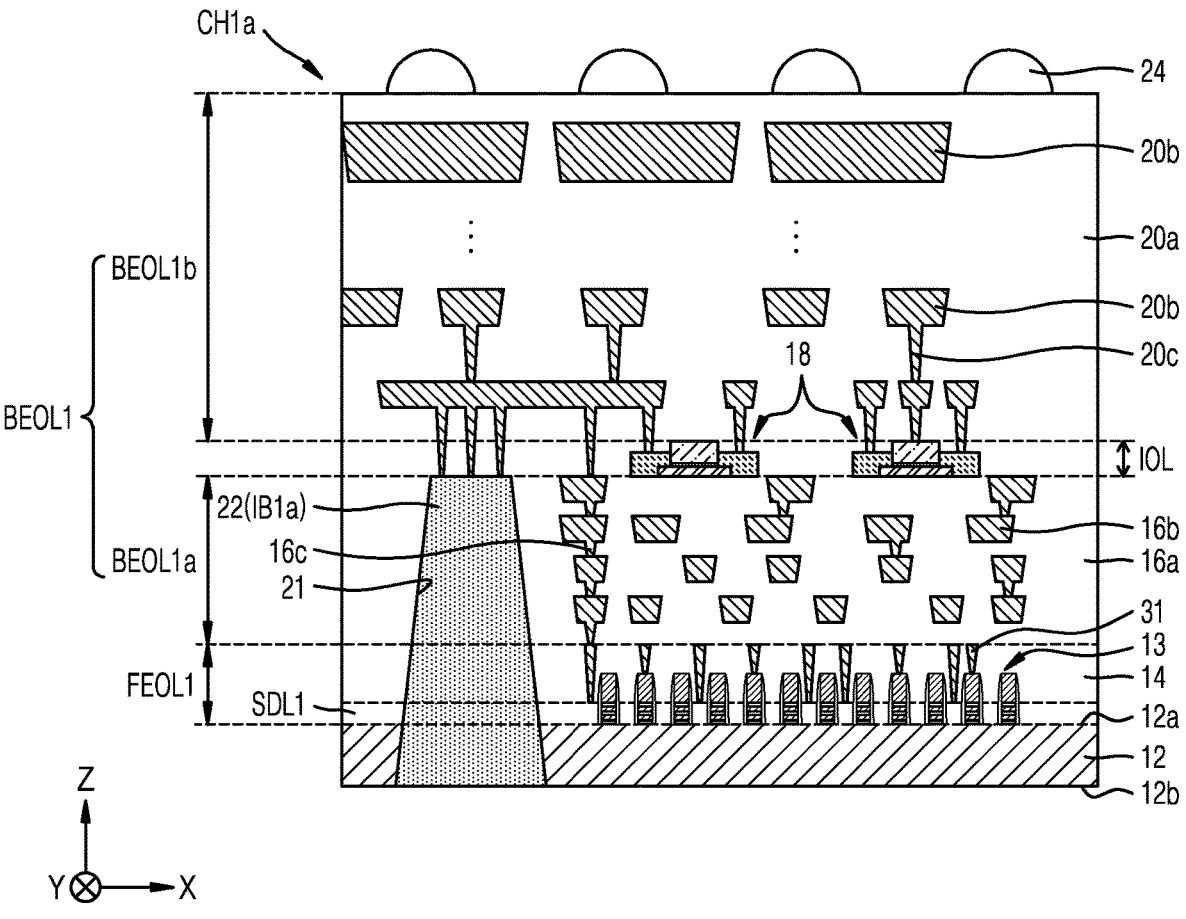
Figure 11:
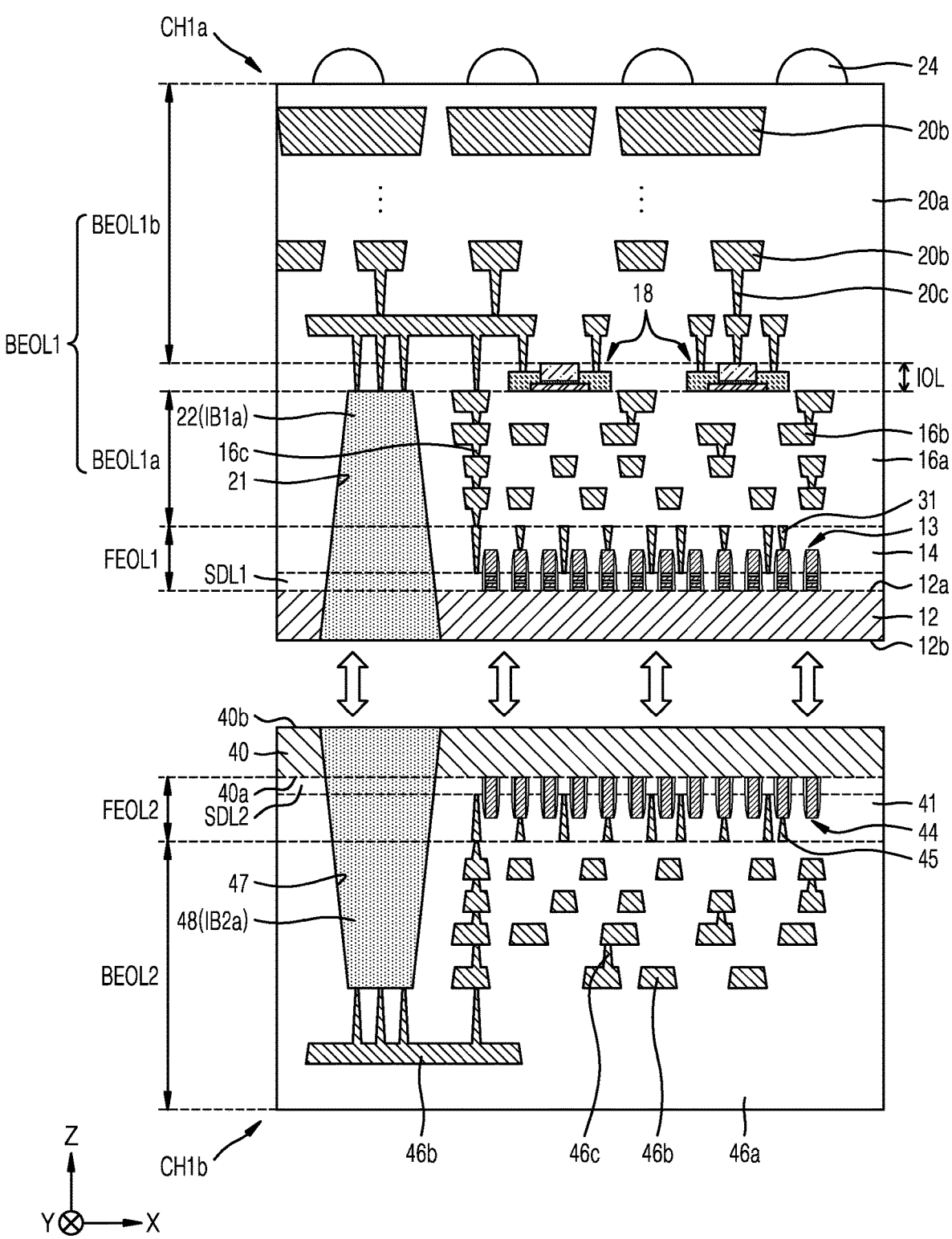

FIGS. 9 to 11 are cross-sectional views illustrating a method of manufacturing the semiconductor package 100 of FIG. 3 according to an example embodiment.

In particular, in FIGS. 9 to 11, like reference numerals as those of FIG. 3 may denote the same members. In the description of FIGS. 9 to 11, description previously given with respect to FIG. 3 is briefly given or omitted.

FIG. 9 is provided to explain a method of manufacturing the second semiconductor chip CH1*b* of the semiconductor package 100 of FIG. 3 according to an example embodiment. Referring to FIG. 9, the second semiconductor substrate 40 having the third surface 40*a* and the fourth surface 40*b* opposite to the third surface 40*a* is prepared. The third surface 40*a* may be a front surface, and the fourth surface 40*b* may be a rear surface. In FIG. 9, the third surface 40*a*, which is a front surface, is shown downward for convenience.

The second front-end level layer FEOL2 may be formed on the third surface 40*a* of the second semiconductor substrate 40. The second front-end level layer FEOL2 may include the second interlayer insulating layer 41, the second integrated circuit device 44, and the second contact plug 45. The second interlayer insulating layer 41, the second integrated circuit device 44, and the second contact plug 45 may be formed on the second semiconductor substrate 40. The second integrated circuit device 44 may include the second source and drain level SDL2.

As described above, the second integrated circuit device 44 may be a slave device. The second integrated circuit device 44 may be a device having a lower operating speed than that of the first integrated circuit device 13. The second integrated circuit device 44 may be a processing device or a logic device. In some example embodiments, the second integrated circuit device 44 may include a FinFET transistor.

A portion of the second back-end level layer BEOL2 may be formed on the second front-end level layer FEOL2. That is, third metal wire layers 46*b*' including the first metal layer M1 to the fourth metal layer M4 and third metal vias 46*c*' electrically connecting the third metal wire layers 46*b*' to each other are formed in a third metal wire insulating layer 46*a*' on the second front-end level layer FEOL2.

The second via hole 47 passing through the third metal wire insulating layer 46*a*', which is a portion of the second back-end level layer BEOL2, the second front-end level layer FEOL2, and the second semiconductor substrate 40 may be formed, and the second through-via structure 48 formed in the second via hole 47 may be formed. The second through-via structure 48 may be the second bonding member IB2*a*.

Subsequently, a third metal wire insulating layer 46*a*'', which is a portion of the second back-end level layer BEOL2, third metal wire layers 46*b*" including the fifth metal layer M5 on the second through-via structure 48, and third metal vias 46*c*" electrically connecting the third metal wire layers 46*b*" to each other may be formed, thereby manufacturing the second semiconductor chip CH1*b*.

FIG. 10 is provided to explain a method of manufacturing the first semiconductor chip CH1*a* of the semiconductor package 100 of FIG. 3 according to an example embodiment. Referring to FIG. 10, the first semiconductor substrate 12 having the first surface 12*a* and the second surface 12*b* opposite to the first surface 12*a* is prepared.

The first front-end level layer FEOL1 may be formed on the first surface 12*a* of the first semiconductor substrate 12. The first front-end level layer FEOL1 may include the first integrated circuit device 13, the first interlayer insulating layer 14, and the first contact plug 31. The first integrated circuit device 13 may include the first source and drain level SDL1.

The first integrated circuit device 13 may be a master device. In some example embodiments, the first integrated circuit device 13 may be a processing device or a logic device. In some example embodiments, the first integrated circuit device 13 may include a multi-bridge channel transistor.

The first sub-back-end level layer BEOL1*a* may be formed on the first front-end level layer FEOL1. The first sub-back-end level layer BEOL1*a* may include the plurality of first metal wire layers 16*b* and the first metal vias 16*c*, which are formed in the first metal wire insulating layer 16*a*.

After the first via hole 21 passing through the first sub-back-end level layer BEOL1*a*, the first front-end level layer FEOL1, and the first semiconductor substrate 12 is formed, the first through-via structure 22 may be formed in the first via hole 21. The first through-via structure 22 may be the first bonding member IB1*a*.

The input and output device level layer IOL may be formed on the first sub-back-end level layer BEOL1*a*. The input and output device level layer IOL may include the two-dimensional input and output device 18. The second sub-back-end level layer BEOL1*b* may be formed on the input and output device level layer IOL. The second sub-back-end level layer BEOL1*b* may include the plurality of second metal wire layers 20*b* and the second metal vias 20*c*, which are formed in the second metal wire insulating layer 20*a*.

Accordingly, the first back-end level layer BEOL1 including the first sub-back-end level layer BEOL1*a* and the second sub-back-end level layer BEOL1*b* may be formed. The first semiconductor chip CH1*a* may be formed through the operations described above. The external bump 24 may be directly formed on the first back-end level layer BEOL1 or may later be formed after a chip bonding operation.

FIG. 11 is provided to explain a bonding operation of the first semiconductor chip CH1*a* and the second semiconductor chip CH1*b* according to an example embodiment. Referring to FIG. 11, first bonding member IB1a configured by the first through-via structure 22 of the first semiconductor chip CH1*a* is directly bonded to the second bonding member IB2*a* configured by the second through-via structure 48 of the second semiconductor chip CH1*b* through a bonding operation.

An insulating layer may be formed on at least one of the second surface 12*b* of the first semiconductor substrate 12 and the fourth surface 40*b* of the second semiconductor substrate 40, and the second surface 12*b* of the first semiconductor substrate 12 may be bonded to the fourth surface 40*b* of the second semiconductor substrate 40 through the insulating layer.

Figure 12:
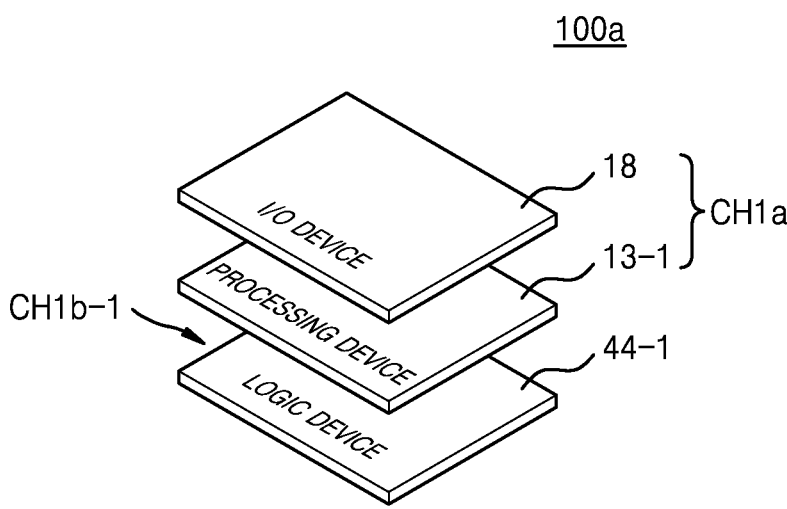
FIGS. 12 and 13 are cross-sectional views illustrating an example of stacking integrated circuit devices and a two-dimensional device of a semiconductor package according to example embodiments.
Figure 13:
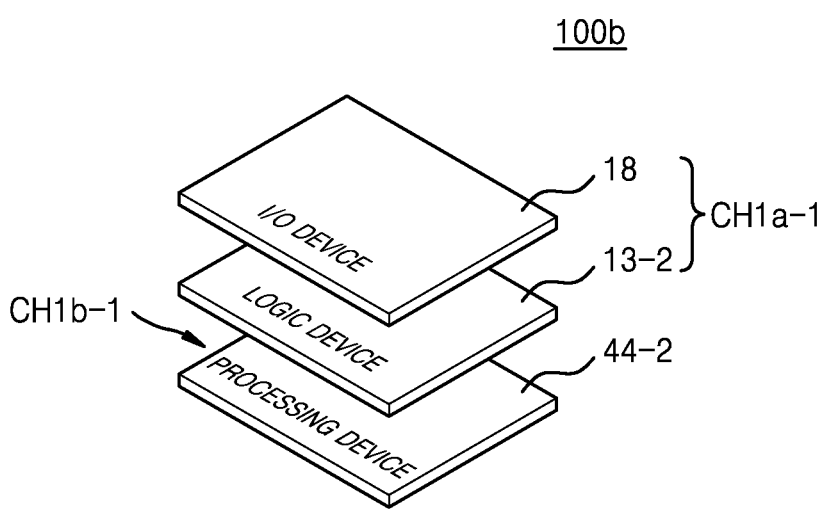

FIGS. 12 and 13 are cross-sectional views illustrating an example of stacking integrated circuit devices and a two-dimensional device of a semiconductor package according to example embodiments.

In particular, FIGS. 12 and 13 are examples of stacking integrated circuit devices and a two-dimensional input and output device configuring the semiconductor package 100 described above with reference to FIGS. 1 to 10. In FIGS. 12 and 13, reference numerals similar to or the same as those of FIGS. 1 to 10 denote the same or similar members.

Referring to FIG. 12, a semiconductor package 100*a* may include the first semiconductor chip CH1*a* stacked on a second semiconductor chip CH1*b*-1. The second semiconductor chip CH1*b*-1 may include a second integrated circuit device 44-1 configured as a logic device. The first semiconductor chip CH1*a* may include a first integrated circuit device 13-1, which is configured as a processing device, and the two-dimensional input and output device 18. Accordingly, the semiconductor package 100*a* may be a stacked package in which a logic device, a processing device, and an input and output device (that is, an I/O device) are sequentially stacked.

Referring to FIG. 13, a semiconductor package 100*b* may include a first semiconductor chip CH1*a*-1 stacked on the second semiconductor chip CH1*b*-1. The second semiconductor chip CH1*b*-1 may include a second integrated circuit device 44-2 configured as a processing device. The first semiconductor chip CH1*a* may include a first integrated circuit device 13-2, which is configured as a logic device, and the two-dimensional input and output device 18. Accordingly, the semiconductor package 100*b* may be a stacked package in which a processing device, a logic device, and an I/O device are sequentially stacked.

Figure 14:
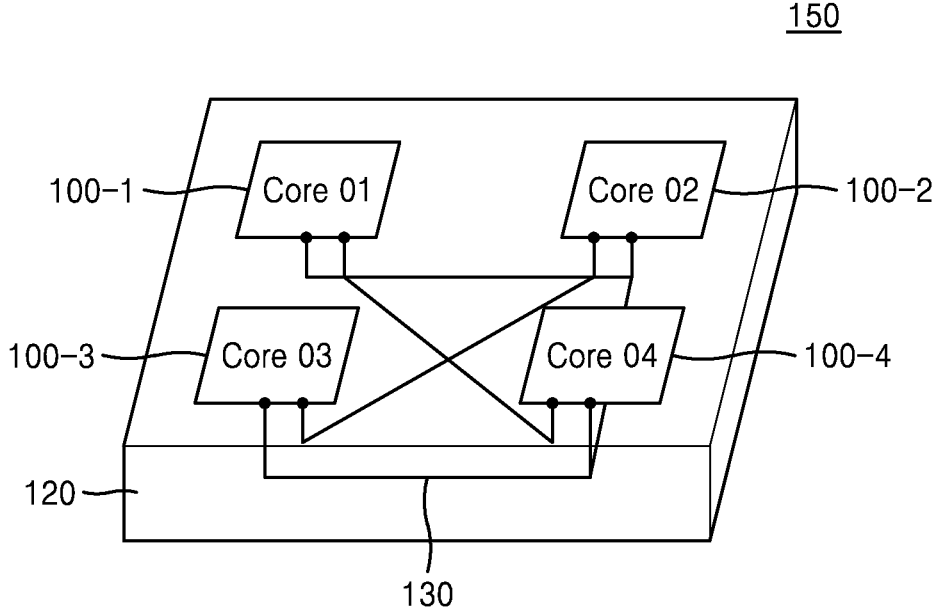
FIG. 14 is a cross-sectional view of a semiconductor package system according to an example embodiment.

FIG. 14 is a cross-sectional view of a semiconductor package system 150 according to an example embodiment.

In particular, FIG. 14 illustrates the semiconductor package system 150 using the semiconductor packages 100, 100*a*, and 100*b* described with reference to FIGS. 1 to 13. In FIGS. 14, reference numerals similar to or the same as those of FIGS. 1 to 13 denote the same or similar members.

The semiconductor package system 150 may include semiconductor packages 100-1, 100-2, 100-3, and 100-4, which are mounted on a package substrate 120. The semiconductor package system 150 may be referred to as a semiconductor package module.

The semiconductor packages 100-1, 100-2, 100-3, and 100-4 in the semiconductor package system 150 may be referred to as a Core 01, a Core 02, a Core 03, and a Core 04, respectively. The package substrate 120 may be an interposer substrate or a printed circuit board (PCB) substrate, and external connection bumps may be further formed below the package substrate 120.

The semiconductor packages 100-1, 100-2, 100-3, and 100-4 may respectively correspond to the semiconductor packages 100, 100*a*, and 100*b* described with reference to FIGS. 1 to 13. Accordingly, the semiconductor packages 100-1, 100-2, 100-3, and 100-4 may each be a stacked package in which a logic device, a processing device, and an I/O device are sequentially stacked, or a stacked package in which a processing device, a logic device, and an I/O device are sequentially stacked.

The semiconductor package system 150 may be a system using chiplet technology. In the semiconductor package system 150, the semiconductor packages 100-1, 100-2,

100-3, and 100-4 may be electrically connected to one another by a connection member 130. In the semiconductor package system 150, the semiconductor packages 100-1, 100-2, 100-3, and 100-4 may be effectively connected to one another by the connection member 130.

Figure 15:
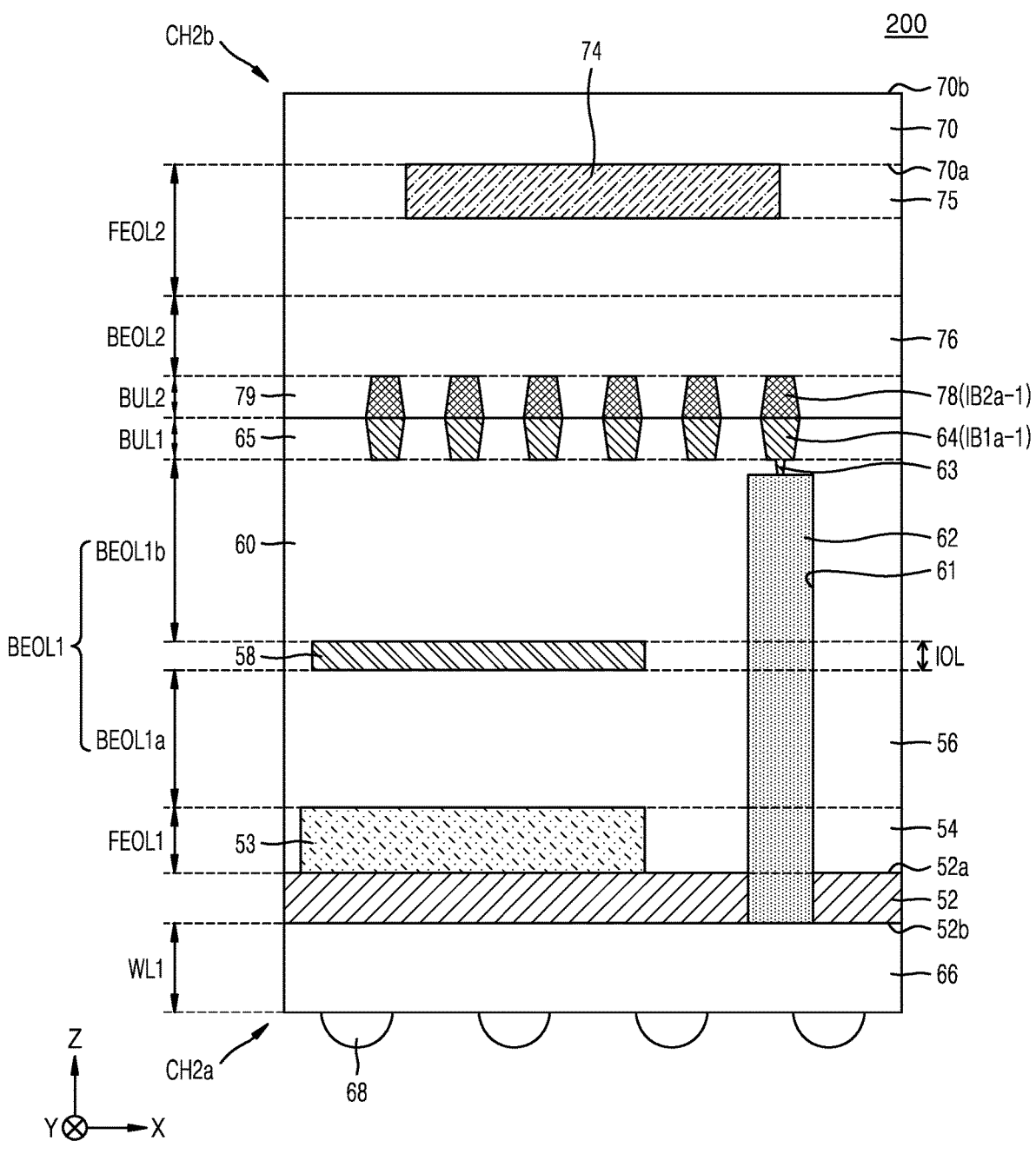
FIG. 15 is a conceptual cross-sectional view of a semiconductor package according to an example embodiment.

FIG. 15 is a conceptual cross-sectional view of a semiconductor package 200 according to an example embodiment.

In particular, the semiconductor package 200 may be substantially the same as the semiconductor package 100 of FIG. 1, except that the arrangement relationship and bonding relationship of semiconductor chips, and the arrangement relationship of integrated circuit devices are different.

The semiconductor package 200 may be configured by bonding a first semiconductor chip CH2*a* to a second semiconductor chip CH2*b*. The first semiconductor chip CH2*a* may be at a lower portion of the semiconductor package 200, and the second semiconductor chip CH2*b* may be at an upper portion of the semiconductor package 200. The first semiconductor chip CH2*a* may correspond to the first semiconductor chip CH1*a* of FIG. 1, and the second semiconductor chip CH2*b* may correspond to the second semiconductor chip CH2*b* of FIG. 1. In the description of FIG. 15, description previously given with respect to FIG. 1 are briefly described or omitted.

The first semiconductor chip CH2*a* includes a first semiconductor substrate 52 having a first surface 52*a* and a second surface 52*b* opposite to the first surface 52*a*. A first integrated circuit device 53 and a first interlayer insulating layer 54 may be formed on the first surface 52*a* of the first semiconductor substrate 52. The first interlayer insulating layer 54 may insulate the first integrated circuit device 53. As shown in FIG. 15, the X and Y directions may be horizontal to the first surface 52*a* of the first semiconductor substrate 52, and the Z direction may be perpendicular to the first surface 52*a* of the first semiconductor substrate 52.

The first semiconductor substrate 52 may be a silicon substrate. The first surface 52*a* may be a front surface, and the second surface 52*b* may be a rear surface. The first integrated circuit device 53 may be a master device. The first integrated circuit device 53 may also be referred to as a first integrated circuit layer. The first integrated circuit device 53 may be a logic device. The first integrated circuit device 53 may include a plurality of transistors.

The first integrated circuit device 53 and the first interlayer insulating layer 54, which are formed on the first surface 52*a* of the first semiconductor substrate 52, may configure a first front-end level layer FEOL1. The first front-end level layer FEOL1 may be a structure formed at a front end of line in a viewpoint of a manufacturing operation.

A first sub-back-end level layer BEOL1*a* may be formed on the first front-end level layer FEOL1. The first sub-back-end level layer BEOL1*a* may include a first metal wire structure 56 electrically connected to the first integrated circuit device 53. The first metal wire structure 56 may include a plurality of first metal wire layers, as described below.

An input and output device level layer IOL may be formed on the first sub-back-end level layer BEOL1*a*. The input and output device level layer IOL may include a two-dimensional input and output device 58. The two-dimensional input and output device 58 may include a plurality of transistors. The two-dimensional input and output device 58 including a two-dimensional channel layer is described below in more detail.

A second sub-back-end level layer BEOL1*b* may be formed on the input and output device level layer IOL. The second sub-back-end level layer BEOL1*b* may include a second metal wire structure 60 electrically connected to the first integrated circuit device 53 and the two-dimensional input and output device 58. The second metal wire structure 60 may include a plurality of second metal wire layers, as described below.

The first semiconductor chip CH2*a* may include a via hole 61 passing through the second sub-back-end level layer BEOL1*b*, the input and output device level layer IOL, the first sub-back-end level layer BEOL1*a*, and the first semiconductor substrate 52 in a direction (i.e., the Z direction) from the second sub-back-end level layer BEOL1*b* toward the first semiconductor substrate 52, and a through-via structure 62 formed in the via hole 61. The through-via structure 62 may include a via insulating liner layer formed in the via hole 61 and a via electrode layer formed on the via insulating liner layer.

The through-via structure 62 may be a TSV structure. The through-via structure 62 may be a via structure for signal transmission or a via structure for power transmission. The through-via structure 62 may be electrically connected to the two-dimensional input and output device 58, second metal wire layers configuring the second metal wire structure 60, and first metal wire layers configuring the first metal wire structure 56. An additional metal via 63 may be formed on the through-via structure 62.

The input and output device level layer IOL may be between the first sub-back-end level layer BEOL1*a* and the second sub-back-end level layer BEOL1*b*. The two-dimensional input and output device 58 included in the input and output device level layer IOL may be between the first sub-back-end level layer BEOL1*a* and the second sub-back-end level layer BEOL1*b*.

The first sub-back-end level layer BEOL1*a* and the second sub-back-end level layer BEOL1*b* may be referred to as a first back-end level layer BEOL1. The first back-end level layer BEOL1 may be a structure manufactured at a back end of line in a viewpoint of a manufacturing operation.

A first bump level layer BUL1 electrically connected to the second metal wire structure 60 and the through-via structure 62 may be formed on the second sub-back-end level layer BEOL1*b* and the through-via structure 62. The first bump level layer BUL1 may include a first internal bump 64 and a first bump insulating layer 65. The first internal bump 64 configures a first bonding member IB1*a*-1.

The second semiconductor chip CH2*b* may include a second semiconductor substrate 70 having a third surface 70*a* and a fourth surface 70*b* opposite to the third surface 70*a*. A second integrated circuit device 74 and a second interlayer insulating layer 75 may be formed below the third surface 70*a* or on the third surface 70*a* of the second semiconductor substrate 70.

As shown in FIG. 15, the X and Y directions may be horizontal to the third surface 70*a* of the second semiconductor substrate 70, and the Z direction may be perpendicular to the third surface 70*a* of the second semiconductor substrate 70. The second interlayer insulating layer 75 may insulate the second integrated circuit device 74. The second integrated circuit device 74 and the second interlayer insulating layer 75 may be arranged below the second semiconductor substrate 70.

The second semiconductor substrate 70 may be a silicon substrate. The third surface 70*a* may be a front surface, and the fourth surface 70*b* may be a rear surface. The second integrated circuit device 74 may be a different type (heterogeneous) of device from the first integrated circuit device 53. The second integrated circuit device 74 may be a slave device. The second integrated circuit device 74 may include a plurality of transistors.

The second integrated circuit device 74 may also be referred to as a second integrated circuit layer. The second integrated circuit device 74 may be a device having a lower operating speed than that of the first integrated circuit device 53. The second integrated circuit device 74 may be a memory device. The second integrated circuit device 74 may be a dynamic random access memory (DRAM) device.

The second integrated circuit device 74 and the second interlayer insulating layer 75, which are formed on the third surface 70a of the second semiconductor substrate 70, may configure a second front-end level layer FEOL2. The second front-end level layer FEOL2 may be a structure formed at a front end of line in a viewpoint of a manufacturing operation.

A second back-end level layer BEOL2 may be formed on the second front-end level layer FEOL2. The second back-end level layer BEOL2 may include a third metal wire structure 76 electrically connected to the second integrated circuit device 74. The third metal wire structure 76 may include a plurality of third metal wire layers, as described below.

A second bump level layer BUL2 electrically connected to the third metal wire structure 76 may be formed on the second back-end level layer BEOL2. The second bump level layer BUL2 may include a second internal bump 78 and a second bump insulating layer 79. The second internal bump 78 configures a second bonding member IB2a-1.

In the first semiconductor chip CH2a, a wire level layer WL1 is further formed below the first semiconductor substrate 52. The wire level layer WL1 may be a redistribution level layer. In the wire level layer WL1, a fourth metal wire structure 66 electrically connected to the through-via structure 62 may be formed. An external bump 68 electrically connected to the through-via structure 62 and the fourth metal wire structure 66 may be formed below the wire level layer WL1.

In some example embodiments, a ratio of the transistors included in the first integrated circuit device 53, the transistors included in the two-dimensional input and output device 58, and the transistors included in the second integrated circuit device 74 may be 55:40:5. In some example embodiments, the ratio described above may be adjusted within a ratio of ±10%.

The semiconductor package 200 may be configured by bonding the second internal bump 78 configuring the second bonding member IB2a-1 to the first internal bump 64 configuring the first bonding member IB1a-1. The second bump insulating layer 79 and the first bump insulating layer 65 may be in contact with each other and may be bonded.

The semiconductor package 200 may include the first semiconductor chip CH2a including the two-dimensional input and output device 58 embedded on the first integrated circuit device 53, and the second semiconductor chip CH2b having the second integrated circuit device 74 and bonded to the first semiconductor chip CH2a.

Accordingly, in the semiconductor package 200, the two-dimensional input and output device 58 is vertically stacked on the first semiconductor substrate 52, and thus, a total area of the semiconductor package 200 may be reduced. The semiconductor package 200 is configured by stacking the first semiconductor chip CH2a and the second semiconductor chip CH2b, and the second bonding member IB2b and the first bonding member IB1a-1 are directly bonded.

In addition, in the semiconductor package 200, because the first and second bonding members IB1a-1 and IB2a-1 are directly connected to the through-via structure 62, performance of the semiconductor package 200 may be optimized by facilitating electrical connection between the first semiconductor chip CH2a and the second semiconductor chip CH2b.

Figure 16:
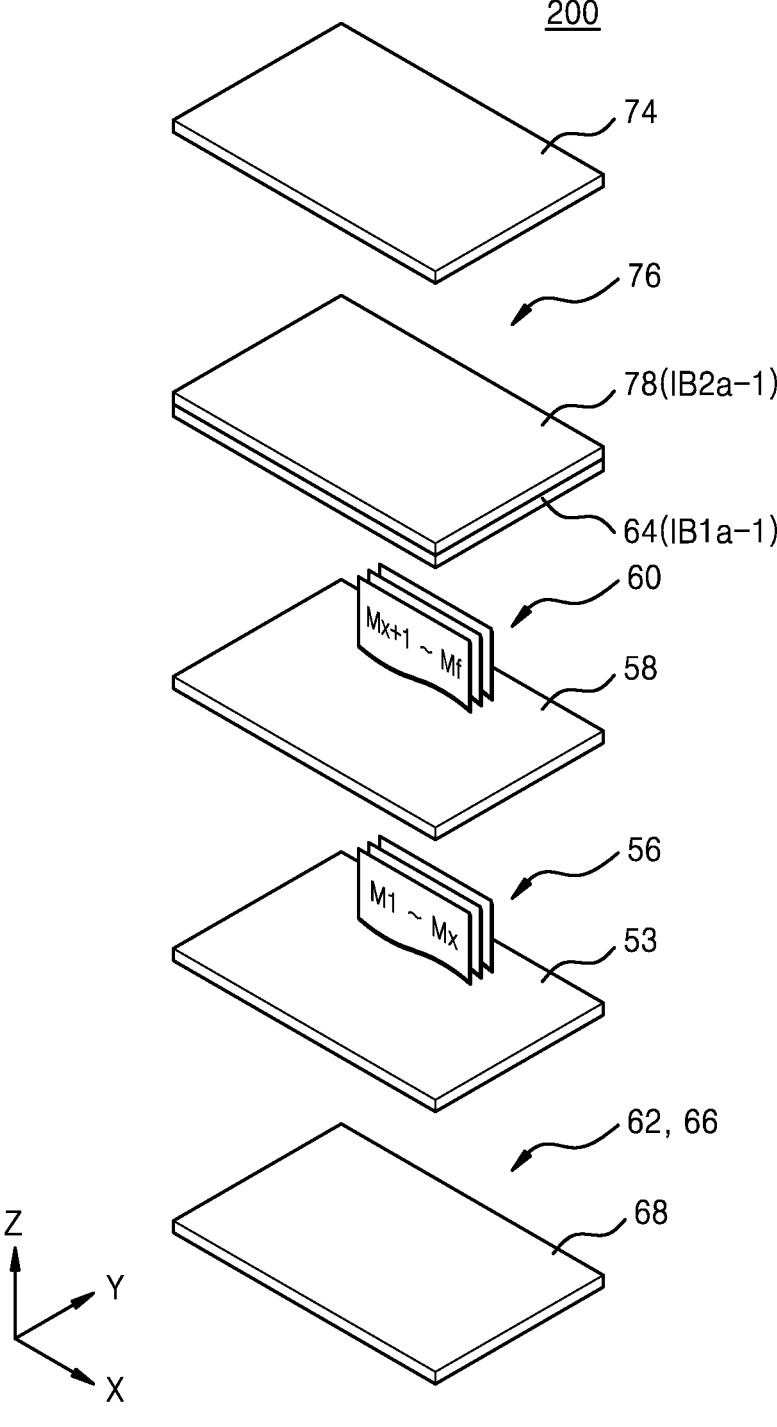
FIG. 16 is a diagram for explaining an arrangement and connection relationship between components of the semiconductor package of FIG. 15 according to an example embodiment.

FIG. 16 is a diagram for explaining an arrangement and connection relationship between components of the semiconductor package 200 of FIG. 15 according to an example embodiment.

In particular, in the semiconductor package 200, the external bump 68 may be arranged lowermost. The first integrated circuit device 53 may be on the external bump 68. The first integrated circuit device 53 may be electrically connected to the external bump 68 by the fourth metal wire structure 66 and the through-via structure 62.

The first metal wire structure 56 may be on the first integrated circuit device 53. The first metal wire structure 56 may include a plurality of first metal wire layers M1 to Mx. The plurality of first metal wire layers M1 to Mx may include a first metal layer M1 to an x-th metal layer Mx (where x is a positive integer).

The two-dimensional input and output device 58 may be on the first metal wire structure 56. The second metal wire structure 60 may be on the two-dimensional input and output device 58. The second metal wire structure 60 may include a plurality of second metal wire layers Mx+1 to Mf. The plurality of second metal wire layers Mx+1 to Mf may include an x+1-th metal layer Mx+1 to an f-th metal layer Mf (where x and f are positive integers). A pitch of metal patterns of the plurality of second metal wire layers Mx+1 to Mf may be greater than that of the plurality of first metal wire layers M1 to Mx.

The two-dimensional input and output device 58 may be between the first metal wire structure 56 and the second metal wire structure 60. In some example embodiments, when f may be 14, and x may be 3, 4, 5, 6 or 7.

In other words, when the first metal wire structure 56 and the second metal wire structure 60 are configured by fourteen metal wire layers, the two-dimensional input and output device 58 may be on three, four, five, six or seven metal layers.

The first bonding member IB1a-1 configured by the first internal bump 64 and the second bonding member IB2a-1 configured by the second internal bump 78 may be on the second metal wire structure 60. The first bonding member IB1a-1 and the second bonding member IB2a-1 may be bonded to each other. The second integrated circuit device 74 electrically connected to the second internal bump 78 through the third metal wire structure 76 may be on the second bonding member IB2a-1 configured by the second internal bump 78.

Figure 17:
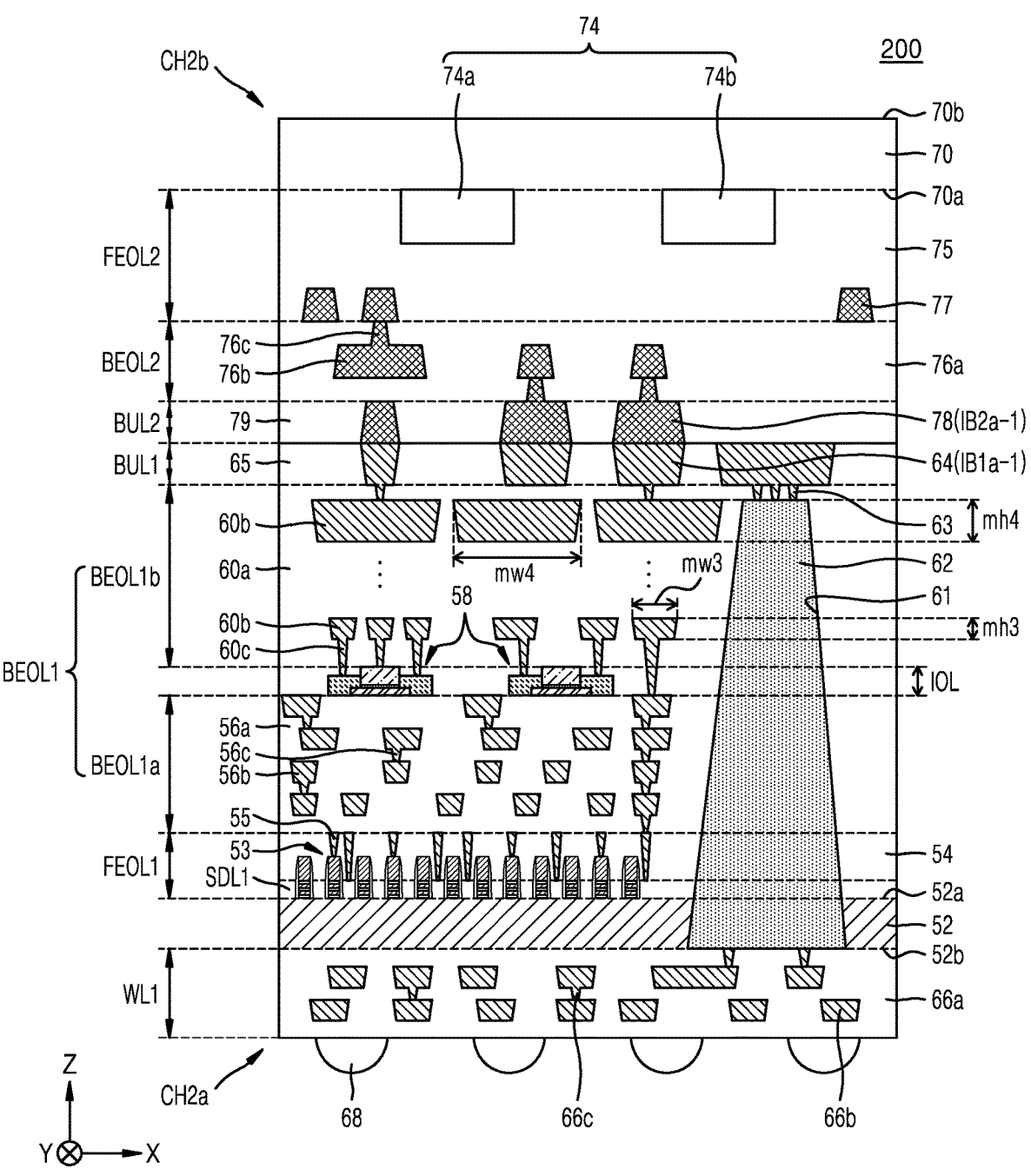
FIG. 17 is a cross-sectional view of a semiconductor package according to an example embodiment.

FIG. 17 is a cross-sectional view of the semiconductor package 200 according to an example embodiment.

In particular, FIG. 17 illustrates an example embodiment in which the semiconductor package 200 of FIG. 15 is implemented. In FIG. 17, the same reference numerals as in FIG. 15 denote the same members. In the description of FIG. 17, description previously given with respect to FIG. 15 is briefly given or omitted.

The semiconductor package 200 may be configured by bonding the first semiconductor chip CH2a to the second semiconductor chip CH2b. In the first semiconductor chip CH2a, the first front-end level layer FEOL1 may be formed on the first surface 52a of the first semiconductor substrate 52. The first front-end level layer FEOL1 may include the first integrated circuit device 53, the first interlayer insulating layer 54, and a first contact plug 55. The first integrated circuit device 53 may include a first source and drain level SDL1.

The first integrated circuit device 53 may be a master device. In some example embodiments, the first integrated circuit device 53 may be a logic device. In some example embodiments, the first integrated circuit device 53 may include a multi-bridge channel transistor. The first integrated circuit device 53 is described below in more detail.

A first sub-back-end level layer BEOL1a electrically connected to the first front-end level layer FEOL1 through the first contact plug 55 may be formed on the first front-end level layer FEOL1. The first sub-back-end level layer BEOL1a may include a first metal wire structure (56 in FIG. 15) electrically connected to the first integrated circuit device 53.

The first metal wire structure 56 may include a plurality of first metal wire layers 56b and first metal vias 56c, which are formed in a first metal wire insulating layer 56a. The first metal vias 56c may be formed between the plurality of first metal wire layers 56b to electrically connect the plurality of first metal wire layers 56b to each other.

The input and output device level layer IOL may be formed on the first sub-back-end level layer BEOL1a. The input and output device level layer IOL may include the two-dimensional input and output device 58. The two-dimensional input and output device 58 including a two-dimensional channel layer is described below in more detail.

The second sub-back-end level layer BEOL1b may be formed on the input and output device level layer IOL. The second sub-back-end level layer BEOL1b may include a second metal wire structure (60 of FIG. 15) electrically connected to the first integrated circuit device 53 and the two-dimensional input and output device 58.

The second metal wire structure 60 may include a plurality of second metal wire layers 60b and second metal vias 60c, which are formed in a second metal wire insulating layer 60a. A second metal wire layer 60b formed at a middle portion of the plurality of second metal wire layers 60b may have a third width mw3 and a third height mh3. A second metal wire layer 60b formed at an upper portion (or an uppermost portion) of the plurality of second metal wire layers 60b may have a fourth width mw4 and a fourth height mh4. The fourth width mw4 and the fourth height mh4 may respectively be greater than the third width mw3 and the third height mh3. The second metal vias 60c may be formed between the plurality of second metal wire layers 60b to electrically connect the plurality of second metal wire layers 60b to each other.

The first semiconductor chip CH2a may have a via hole 61 passing through the second sub-back-end level layer BEOL1b, the input and output device level layer IOL, the first sub-back-end level layer BEOL1a, and the first semiconductor substrate 52, and the through-via structure 62 formed in the via hole 61.

The through-via structure 62 may be a TSV structure. The through-via structure 62 may be a via structure for signal transmission or a via structure for power transmission. The through-via structure 62 may be electrically connected to the two-dimensional input and output device 58, second metal wire layers configuring the second metal wire structure 60, and first metal wire layers configuring the first metal wire structure 56. An additional metal via 63 may be formed on the through-via structure 62.

The first sub-back-end level layer BEOL1a and the second sub-back-end level layer BEOL1b may be referred to as the first back-end level layer BEOL1. The first back-end level layer BEOL1 may be a structure manufactured at a back end of line in a viewpoint of a manufacturing operation.

The input and output device level layer IOL may be positioned at a central portion of the first back-end level layer BEOL1, that is, between the first sub-back-end level layer BEOL1a and the second sub-back-end level layer BEOL1b. The two-dimensional input and output device 58 included in the input and output device level layer IOL may be between the first sub-back-end level layer BEOL1a and the second sub-back-end level layer BEOL1b.

The first bump level layer BUL1 electrically connected to the second metal wire structure 60 and the through-via structure 62 may be formed on the second sub-back-end level layer BEOL1b and the through-via structure 62. The first bump level layer BUL1 may include the first internal bump 64 and the first bump insulating layer 65. The first internal bump 64 configures the first bonding member IB1a-1.

In the second semiconductor chip CH2b, the second front-end level layer FEOL2 may be formed below the third surface 70a of the second semiconductor substrate 70. The second front-end level layer FEOL2 may include second integrated circuit device 74, the second interlayer insulating layer 75, and a second contact plug 77. The second integrated circuit device 74 may include a transistor 74a and a capacitor 74b.

The second integrated circuit device 74 may be slave device. The second integrated circuit device 74 may each be a device having a lower operating speed than that of the first integrated circuit device 53. The second integrated circuit device 74 may be a memory device. In some example embodiments, the second integrated circuit device 74 may include a planar transistor.

The second back-end level layer BEOL2 electrically connected to the second front-end level layer FEOL2 through the second contact plug 77 may be formed on the second front-end level layer FEOL2. The second back-end level layer BEOL2 may include a third metal wire structure (76 of FIG. 15) electrically connected to the second integrated circuit device 74.

The third metal wire structure 76 may include a plurality of third metal wire layers 76b and third metal vias 76c, which are formed in a third metal wire insulating layer 76a. The third metal vias 76c may be formed between the plurality of third metal wire layers 76b to electrically connect the plurality of third metal wire layers 76b to each other.

The second bump level layer BUL2 electrically connected to the third metal wire structure (76 of FIG. 15) may be formed on the second back-end level layer BEOL2. The second bump level layer BUL2 may include the second internal bump 78 and the second bump insulating layer 79. The second internal bump 78 configures the second bonding member IB2a-1. The second bonding member IB2a-1 configured by the second internal bump 78 may be bonded to the first bonding member IB1a-1 configured by the first internal bump 64.

In the first semiconductor chip CH2a, the wire level layer WL1 is further formed below the first semiconductor substrate 52. The wire level layer WL1 may be a redistribution level layer. In the wire level layer WL1, a fourth metal wire structure (66 of FIG. 15) electrically connected to the through-via structure 62 may be formed.

The fourth metal wire structure (66 of FIG. 15) may include a plurality of fourth metal wire layers 66b and fourth metal vias 66c, which are formed in a fourth metal wire insulating layer 66a. The fourth metal vias 66c may be formed between the plurality of fourth metal wire layers 66b to electrically connect the plurality of fourth metal wire layers 66b to each other. The external bump 68 electrically connected to the through-via structure 62 and the fourth metal wire structure 66 may be formed below the wire level layer WL1.

In the semiconductor package 200, because the two-dimensional input and output device 58 is vertically stacked on the first semiconductor substrate 52, the performance of the semiconductor package 200 may be optimized by reducing a total area of the semiconductor package 200 and facilitating an electrical connection between the first semiconductor chip CH2a and the second semiconductor chip CH2b.

Figure 18:
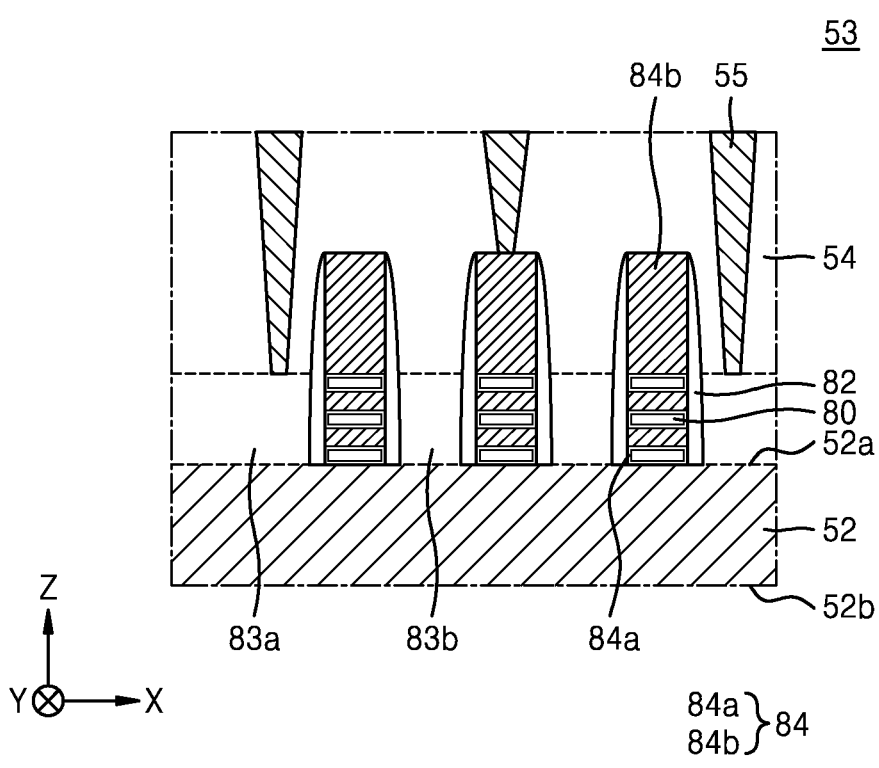
FIG. 18 is an enlarged cross-sectional view of a first integrated circuit device of the semiconductor package of FIG. 17 according to an example embodiment.

FIG. 18 is an enlarged cross-sectional view of the first integrated circuit device 53 of the semiconductor package of FIG. 17.

In particular, the first integrated circuit device 53 may include a multi-bridge channel transistor. The first integrated circuit device 53 may be implemented on the first semiconductor substrate 52. The first integrated circuit device 53 may include a nano-sheet structure 80 formed on the first surface 52a of the first semiconductor substrate 52.

The first integrated circuit device 53 may include a gate structure surrounding the nano-sheet structure 80, and gate spacers 82 formed on both sidewalls of the gate structure 84. The gate structure 84 may include a gate insulating layer 84a and a gate electrode 84b.

In addition, the first integrated circuit device 53 may include first source and drain areas 83a and 83b formed on the first semiconductor substrate 52 and between the gate spacers 82. The first source and drain areas 83a and 83b configure a first source and drain level SDL1 on the first surface 52a of the first semiconductor substrate 52. The first source and drain areas 83a and 83b may be electrically connected to the first contact plug 55.

Figure 19:
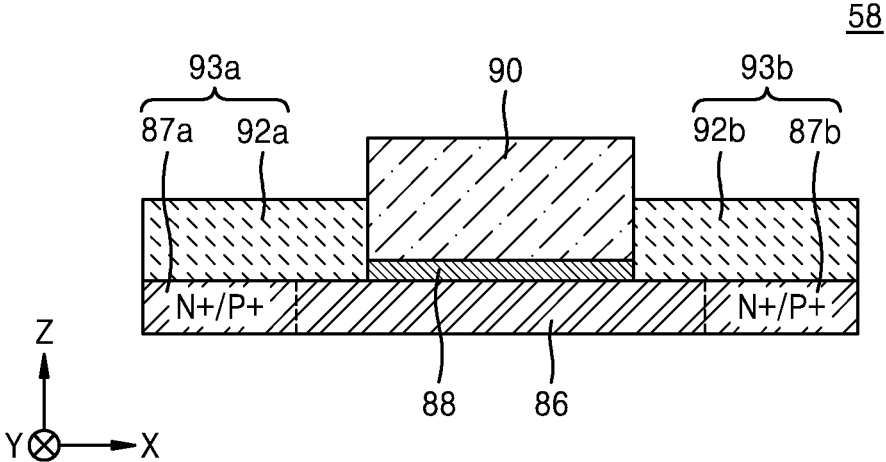
FIG. 19 is an enlarged cross-sectional view of a two-dimensional input and output device of the semiconductor package of FIG. 17 according to an example embodiment.

FIG. 19 is an enlarged cross-sectional view of the two-dimensional input and output device 58 of the semiconductor package of FIG. 17.

In particular, the two-dimensional input and output device 58 may include a two-dimensional channel layer 86 formed on a first metal wire insulating layer (56a of FIG. 17). The two-dimensional channel layer 86 may be a two-dimensional material without deterioration of electrical mobility in a monolayer scale. The two-dimensional channel layer 86 may be configured by a transition metal di-chalcogenide compound or black phosphorus. The transition metal di-chalcogenide compound may include at least one of $MoS_2$, $WTe_2$, $WSe_2$, $ReS_2$, $MoTe_2$, $MoSe_2$, $SnS_2$, $ReSe_2$, $HfSe_2$, and $HfS_2$.

The two-dimensional input and output device 58 may include a gate insulating layer 88 and a gate electrode 90 formed on the two-dimensional channel layer 86. The gate insulating layer 88 and the gate electrode 90 may form a gate structure.

The two-dimensional input and output device 58 may include a source structure 93a and a drain structure 93b formed on the two-dimensional channel layer 86 and respectively on both sides of the gate insulating layer 88 and the gate electrode 90. The source structure 93a may include a source dopant layer 87a and a source semimetal layer 92a, which are formed on the two-dimensional channel layer 86 and on one side of the gate insulating layer 88 and the gate electrode 90.

The drain structure 93b may include a drain dopant layer 87b and a drain semimetal layer 92b, which are formed on the two-dimensional channel layer 86 and on the other side of the gate insulating layer 88 and the gate electrode 90.

In some example embodiments, the source dopant layer 89a and the drain dopant layer 87b may each be an N+ dopant layer. In some example embodiments, the source dopant layer 89a and the drain dopant layer 87b may each be a P+ dopant layer. The source semimetal layer 92a and the drain semimetal layer 92b may each include a metal, for example, bismuth (Bi).

The source dopant layer 87a and the drain dopant layer 87b may implement an ohmic contact respectively with the source semimetal layer 92a and the drain semimetal layer 92b to reduce contact resistance.

Figure 20:
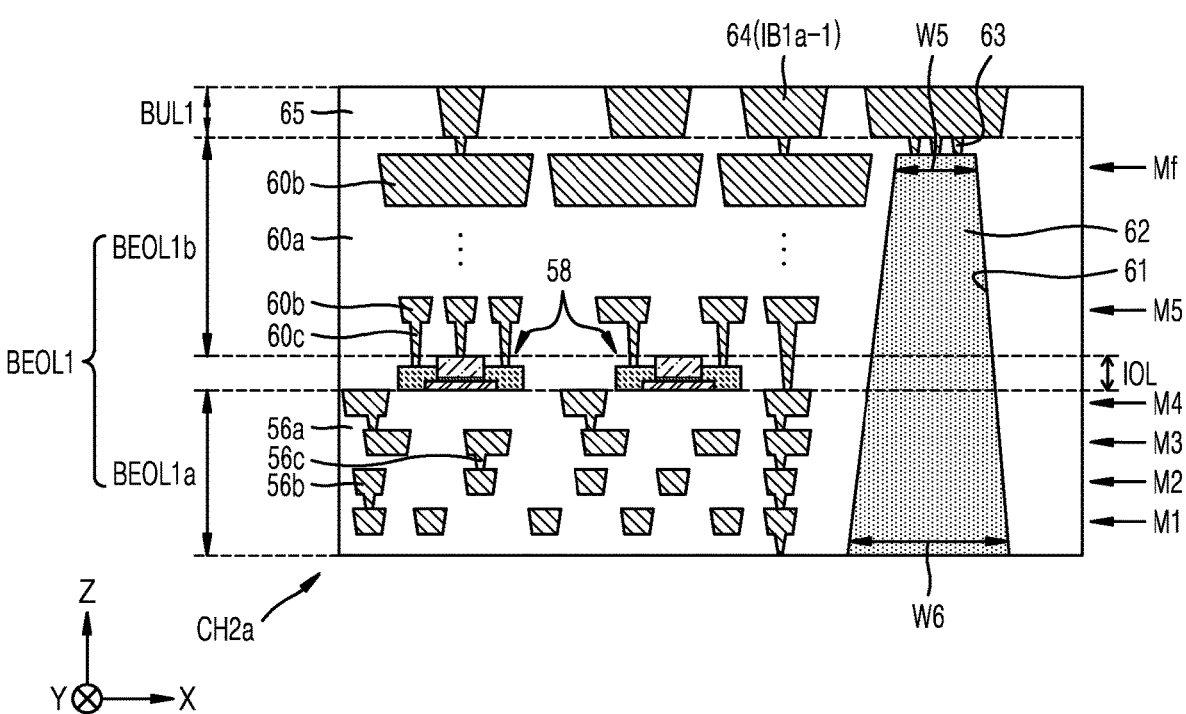
FIG. 20 is an enlarged cross-sectional view of a first back-end level layer and an input and output device level layer of a first semiconductor chip of the semiconductor package of FIG. 17 according to an example embodiment.

FIG. 20 is an enlarged cross-sectional view of the first back-end level layer BEOL1 and the input and output device level layer IOL of the first semiconductor chip CH2a of the semiconductor package 200 of FIG. 17.

In the description of FIG. 20, description previously given with respect to FIG. 17 is briefly given or omitted. The first back-end level layer BEOL1 of the first semiconductor chip CH2a may include the first sub-back-end level layer BEOL1a and the second sub-back-end level layer BEOL1b.

The first sub-back-end level layer BEOL1a may include the plurality of first metal wire layers 56b and first metal vias 56c, which are formed in the first metal wire insulating layer 56a. In some example embodiments, the plurality of first metal wire layers 56b may include four metal layers, that is, a first metal layer M1, a second metal layer M2, a third metal layer M3, and a fourth metal layer M4.

The second sub-back-end level layer BEOL1b may include the plurality of second metal wire layers 60b and the second metal vias 60c, which are formed in the second metal wire insulating layer 60a. In some example embodiments, the plurality of second metal wire layers 60b may include f-4 (where f is a positive integer) metal layers, that is, a fifth metal layer M5, a sixth metal layer M5, and an f-th metal layer Mf.

The input and output device level layer IOL may be positioned at a central portion of the first back-end level layer BEOL1, that is, between the fourth metal layer M4 of the first sub-back-end level layer BEOL1a and the fifth metal layer M5 of the second sub-back-end level layer BEOL1b. In some example embodiments, the plurality of first metal wire layers 56b and the plurality of second metal wire layers 60b may include up to twenty metal layers. That is, in the f-th metal layer Mf, f may be equal to or less than 20.

In the through-via structure 62 formed in the first sub-back-end level layer BEOL1a and the second sub-back-end level layer BEOL1b, an upper width W5 thereof may be less than a lower width W6 thereof.

The first bump level layer BUL1 electrically connected to the second metal wire structure 60 and the through-via structure 62 may be formed on the second sub-back-end level layer BEOL1b and the through-via structure 62. The first bump level layer BUL1 may include the first internal bump 64 and the first bump insulating layer 65. The first internal bump 64 configures the first bonding member IB1a-1.

Figure 21:
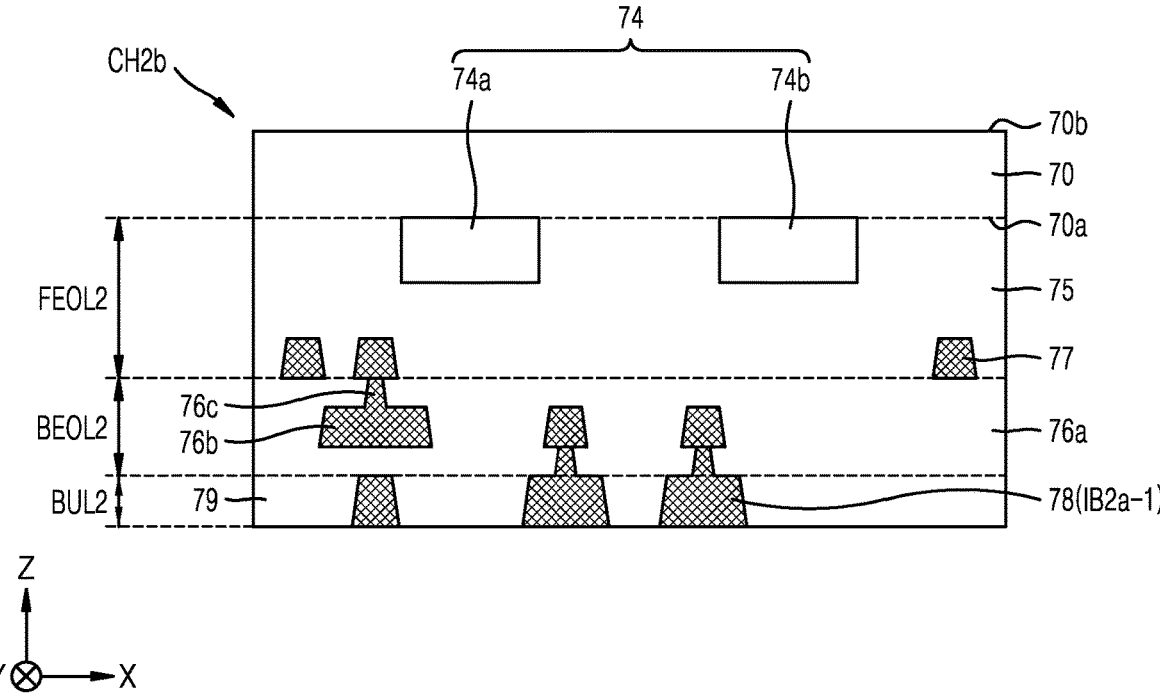
Figure 22:
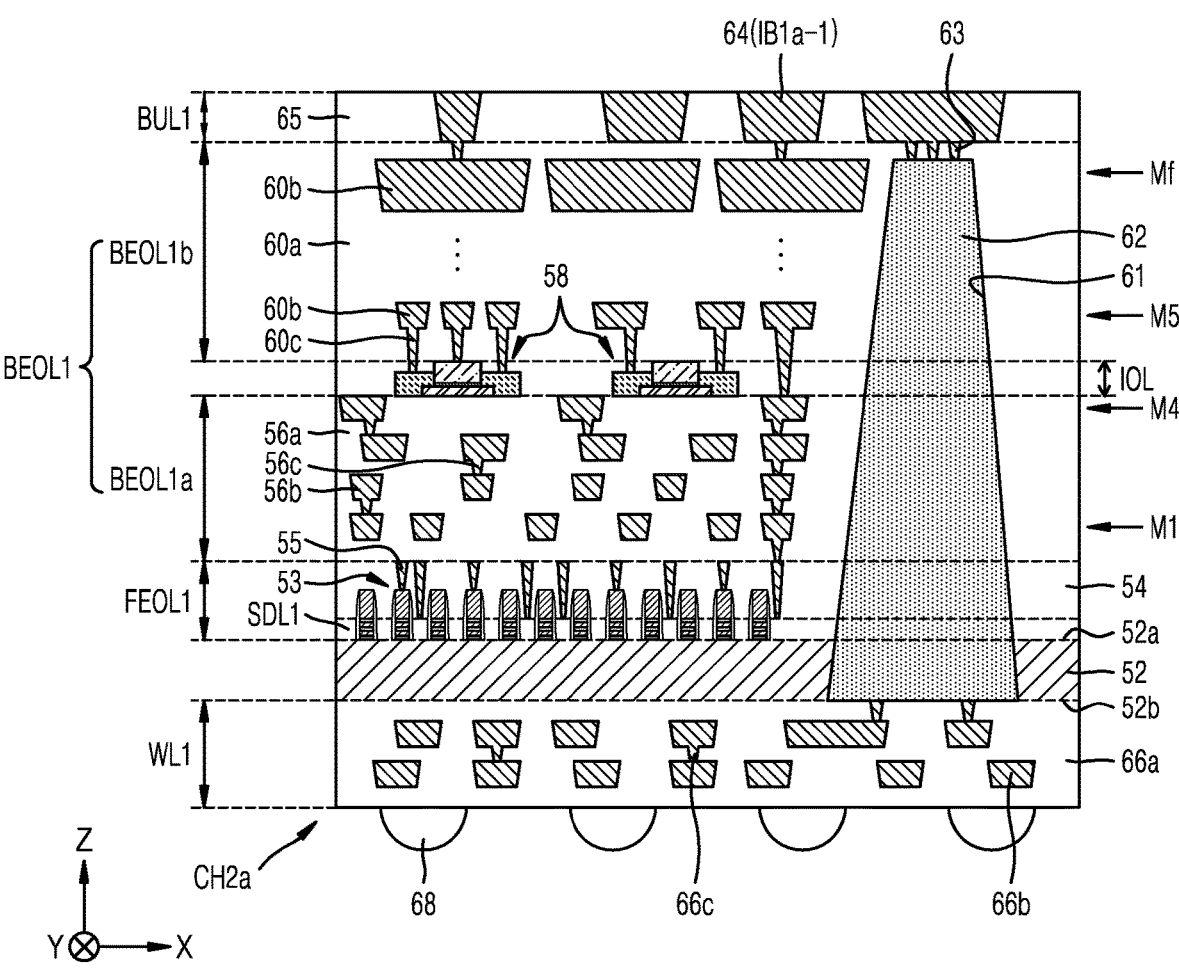
Figure 23:
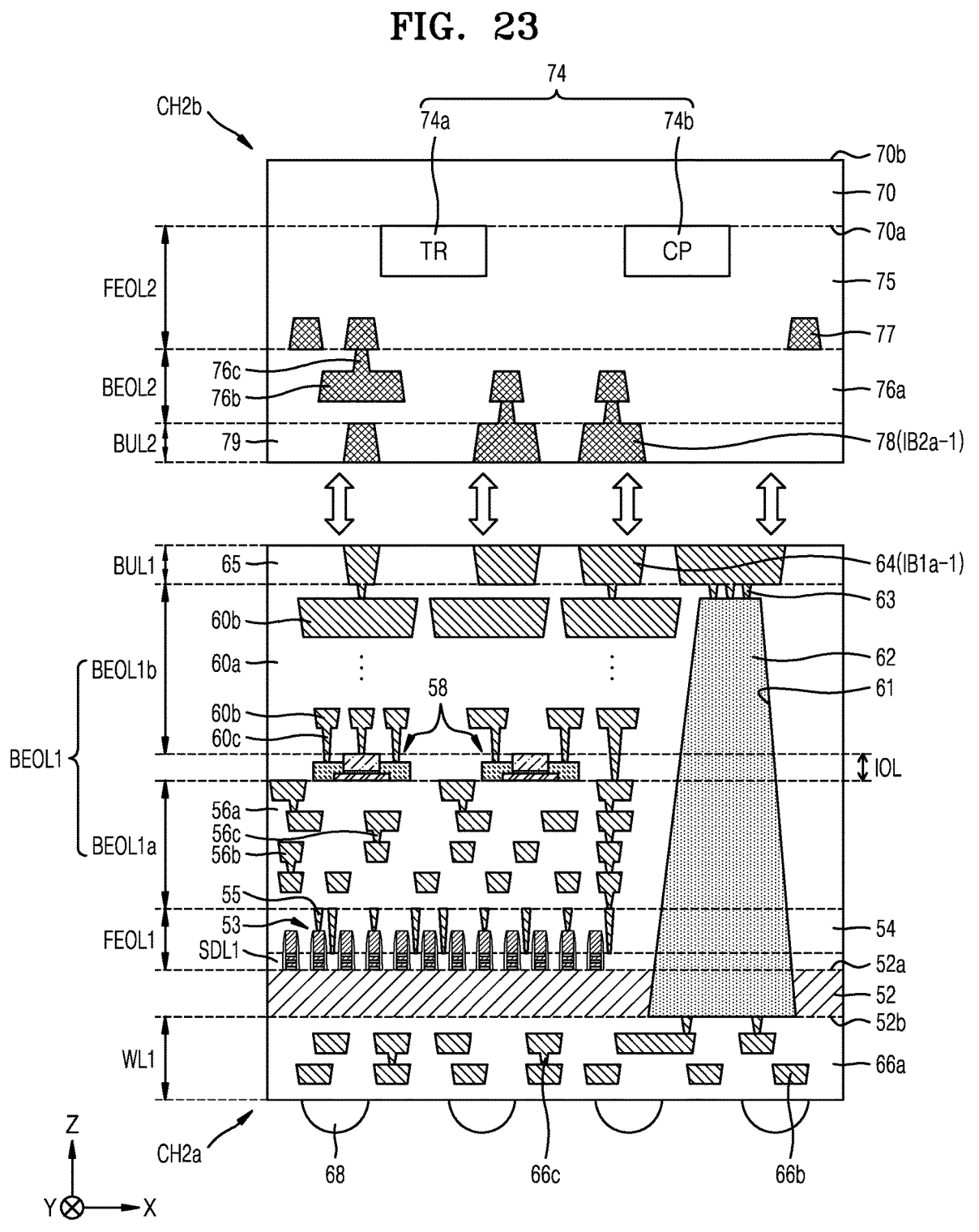

FIGS. 21 to 23 are cross-sectional views illustrating a method of manufacturing the semiconductor package 200 of FIG. 17 according to an example embodiment.

In FIGS. 21 and 23, the same reference numerals as those in FIG. 17 denote the same members. In the description of FIGS. 21 and 23, description previously given with respect to FIG. 17 will be briefly described or omitted.

FIG. 21 is provided to explain a method of manufacturing the second semiconductor chip CH2b of the semiconductor package 200 according to an example embodiment. The second semiconductor substrate 70 is prepared. The third surface 70a may be a front surface, and the fourth surface 70b may be a rear surface. In FIG. 21, the third surface 70a, which is a front surface, is shown downward for convenience.

The second front-end level layer FEOL2 may be formed on the third surface 70a of the second semiconductor substrate 70. The second front-end level layer FEOL2 may include the second integrated circuit device 74, the second interlayer insulating layer 75, and the second contact plug 77. The second integrated circuit device 74 may include a transistor 74a and a capacitor 74b.

As described above, the second integrated circuit device 74 may be slave device. The second integrated circuit device 74 may each be a device having a lower operating speed than that of the first integrated circuit device 53. The second integrated circuit device 74 may be a memory device. In some example embodiments, the second integrated circuit device 74 may include a planar transistor.

The second back-end level layer BEOL2 may be formed on the second front-end level layer FEOL2. The second back-end level layer BEOL2 may include the plurality of third metal wire layers 76b and third metal vias 76c, which are formed in the third metal wire insulating layer 76a.

The second bump level layer BUL2 may be formed on the second back-end level layer BEOL2. The second bump level layer BUL2 may include the second internal bump 78 and the second bump insulating layer 79. The second internal bump 78 configures the second bonding member IB2a-1.

FIG. 22 is provided to explain a method of manufacturing the first semiconductor chip CH2a of the semiconductor package 200 according to an example embodiment. The first semiconductor substrate 52 is prepared.

The first front-end level layer FEOL1 may be formed on the first surface 52a of the first semiconductor substrate 52. The first front-end level layer FEOL1 may include the first integrated circuit device 53, the first interlayer insulating layer 54, and the first contact plug 55. The first integrated circuit device 53 may include a first source and drain level SDL1.

The first integrated circuit device 53 may be a master device. In some example embodiments, the first integrated circuit device 53 may be a logic device. In some example embodiments, the first integrated circuit device 53 may include a multi-bridge channel transistor.

The first sub-back-end level layer BEOL1a may be formed on the first front-end level layer FEOL1. The first sub-back-end level layer BEOL1a may include the plurality of first metal wire layers 56b and first metal vias 56c, which are formed in the first metal wire insulating layer 56a.

The input and output device level layer IOL may be formed on the first sub-back-end level layer BEOL1a. The input and output device level layer IOL may include the two-dimensional input and output device 18. The second sub-back-end level layer BEOL1b may be formed on the input and output device level layer IOL. The second sub-back-end level layer BEOL1b may include the plurality of second metal wire layers 60b and the second metal vias 60c, which are formed in the second metal wire insulating layer 60a. Accordingly, the first back-end level layer BEOL1 including the first sub-back-end level layer BEOL1a and the second sub-back-end level layer BEOL1b may be formed.

The via hole 61 passing through the second sub-back-end level layer BEOL1b, the input and output device level layer IOL, the first sub-back-end level layer BEOL1a, and the first semiconductor substrate 52 may be formed, and the through-via structure 62 may be formed in the via hole 61. An additional metal via 63 may be formed on the through-via structure 62.

The first bump level layer BUL1 electrically connected to the second metal wire structure 60 and the through-via structure 62 may be formed on the second sub-back-end level layer BEOL1b and the through-via structure 62. The first bump level layer BUL1 may include the first internal bump 64 and the first bump insulating layer 65. The first internal bump 64 configures the first bonding member IB1a-1.

In addition, the wire level layer WL1 may be formed below the first semiconductor substrate 52. The wire level layer WL1 may include the plurality of fourth metal wire layers 66b and the fourth metal vias 66c, which are formed in the fourth metal wire insulating layer 66a.

The first semiconductor chip CH2a may be formed through the operations described above. Additionally, the external bump 68 electrically connected to the through-via structure 62 and the fourth metal wire structure 66 may be formed below the wire level layer WL1.

FIG. 23 is provided to explain a bonding operation of the first semiconductor chip CH2a and the second semiconductor chip CH2b. As shown, the first bonding member IB1a-1 configured by the first internal bump 64 of the first semiconductor chip CH2a is directly bonded to the second bonding member IB2a-1 configured by the second internal bump 78 of the second semiconductor chip CH2b through a bonding operation.

In addition, the first bump insulating layer 65 of the first bump level layer BUL1 may also be bonded to the second bump insulating layer 79 of the second bump level layer BUL2 through a bonding operation.

Figure 24:
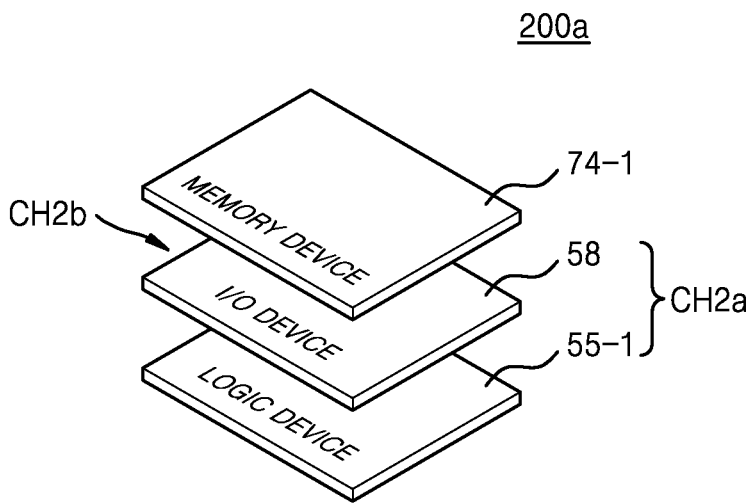
FIGS. 24 and 25 are cross-sectional views illustrating an example of stacking integrated circuit devices and a two-dimensional device of a semiconductor package according to example embodiments.
Figure 25:
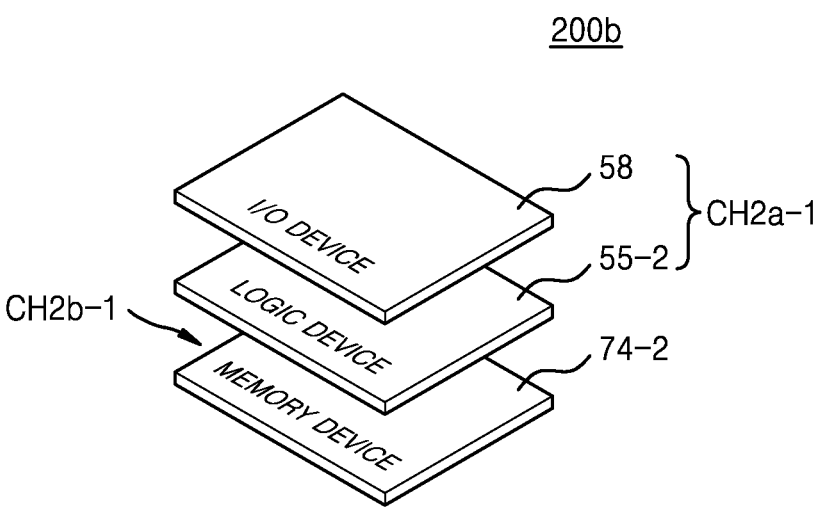

FIGS. 24 and 25 are cross-sectional views illustrating an example of stacking integrated circuit devices and a two-dimensional device of a semiconductor package according to example embodiments.

In particular, FIGS. 24 and 25 are examples of stacking integrated circuit devices and a two-dimensional input and output device configuring the semiconductor package 200 described above with reference to FIGS. 15 to 23. In FIGS. 24 and 25, reference numerals similar to or the same as those of FIGS. 15 to 23 denote the same or similar members.

Referring to FIG. 24, a semiconductor package 200a may include the second semiconductor chip CH2b stacked on the first semiconductor chip CH2a. The first semiconductor chip CH2a may include a first integrated circuit device 55-1, which is configured as a logic device, and the two-dimensional input and output device 58. The second semiconductor chip CH2b may include a second integrated circuit device 74-1 configured as a memory device. Accordingly, the semiconductor package 200a may be a stacked package in which a logic device, a two-dimensional input and output device, and a memory device are sequentially stacked.

Referring to FIG. 25, a semiconductor package 200b may include a first semiconductor chip CH2a-1 stacked on a second semiconductor chip CH2b-1. The second semiconductor chip CH2b-1 may include a second integrated circuit device 74-2 configured as a memory device. The first semiconductor chip CH2a-1 may include a first integrated circuit device 55-2, which is configured as a logic device, and the two-dimensional input and output device 58. Accordingly, the semiconductor package 200b may be a stacked package in which a memory device, a logic device, and an I/O device are sequentially stacked.

Figure 26:
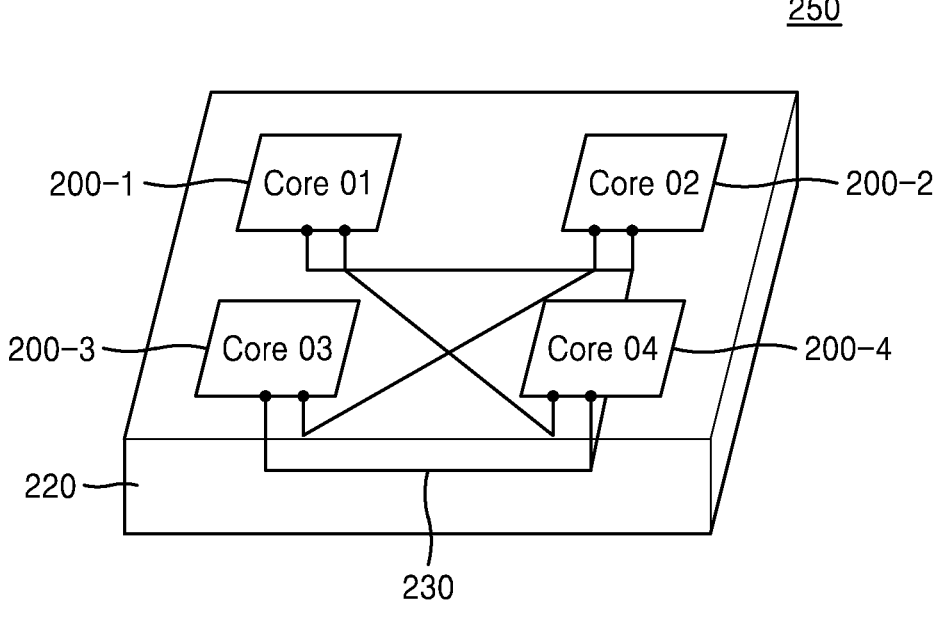
FIG. 26 is a cross-sectional view of a semiconductor package system using a semiconductor package according to an example embodiment.

FIG. 26 is a cross-sectional view of a semiconductor package system 250 using a semiconductor package according to an example embodiment.

In particular, FIG. 26 illustrates the semiconductor package system 250 using the semiconductor packages 200, 200*a*, and 200*b* described with reference to FIGS. 15 to 24. In FIGS. 26, reference numerals similar to or the same as those of FIGS. 15 to 24 denote the same or similar members.

The semiconductor package system 250 may include semiconductor packages 200-1, 200-2, 200-3, and 200-4, which are mounted on a package substrate 220. The semiconductor package system 250 may be referred to as a semiconductor package module.

The semiconductor packages 200-1, 200-2, 200-3, and 200-4 in the semiconductor package system 250 may be referred to as a Core 01, a Core 02, a Core 03, and a Core 04, respectively. The package substrate 220 may be an interposer substrate or a PCB substrate, and external connection bumps may be further formed below the package substrate 220.

The semiconductor packages 200-1, 200-2, 200-3, and 200-4 may correspond to the semiconductor packages 200, 200*a*, and 200*b* described with reference to FIGS. 15 to 24. Accordingly, the semiconductor packages 200-1, 200-2, 200-3, and 200-4 may be a stacked package in which a logic device, an I/O device, and a memory device are sequentially stacked, or a stacked package in which a memory device, a logic device, and an I/O device are sequentially stacked.

The semiconductor package system 250 may be a system using chiplet technology. In the semiconductor package system 250, the semiconductor packages 200-1, 200-2, 200-3, and 200-4 may be electrically connected to one another by a connection member 230. In the semiconductor package system 250, the semiconductor packages 200-1, 200-2, 200-3, and 200-4 may be effectively connected to one another by the connection member 230.

While aspects of example embodiments have been particularly shown and described, it will be understood that various changes in form and details may be made therein without departing from the spirit and scope of the following claims.

What is claimed is:

1. A semiconductor package comprising:
   a first semiconductor chip comprising:
   a first bonding structure;
   a first front-end level layer provided on a first semiconductor substrate and comprising a first integrated circuit device;
   a first sub-back-end level layer provided on the first front-end level layer and comprising a plurality of first metal wire layers electrically connected to the first integrated circuit device;
   an input and output device level layer provided on the first sub-back-end level layer and comprising a two-dimensional input and output device; and
   a second sub-back-end level layer provided on the input and output device level layer and comprising a plurality of second metal wire layers electrically connected to the first integrated circuit device and the two-dimensional input and output device; and
   a second semiconductor chip comprising:
   a second bonding structure bonded to the first bonding structure of the first semiconductor chip;

a second front-end level layer provided on a second semiconductor substrate and comprising a second integrated circuit device; and
   a second back-end level layer provided on the second front-end level layer and comprising a plurality of third metal wire layers electrically connected to the second integrated circuit device.

2. The semiconductor package of claim 1, wherein the two-dimensional input and output device comprises a two-dimensional channel layer, a gate structure provided on the two-dimensional channel layer, and a source structure and a drain structure, which are provided on the two-dimensional channel layer and respectively on both sides of the gate structure.

3. The semiconductor package of claim 2, wherein the two-dimensional channel layer comprises a transition metal di-chalcogenide compound or black phosphorus, and
   wherein the source structure and the drain structure respectively comprise source and drain dopant layers provided on the two-dimensional channel layer, and source and drain semimetal layers respectively provided on the source and drain dopant layers.

4. The semiconductor package of claim 1, wherein the plurality of first metal wire layers and the plurality of second metal wire layers comprise first to fourteenth metal layers sequentially provided on the first semiconductor substrate, and
   wherein the input and output device level layer is provided between the third metal layer and the seventh metal layer.

5. The semiconductor package of claim 1, wherein a number of metal layers provided in the plurality of first metal wire layers and the plurality of second metal wire layers is greater than a number of metal layers provided in the plurality of third metal wire layers.

6. The semiconductor package of claim 1, wherein the first integrated circuit device comprises a master device, and the second integrated circuit device comprises a slave device.

7. The semiconductor package of claim 6, wherein the master device comprises a processing device, and the slave device comprises a logic device.

8. The semiconductor package of claim 6, wherein the master device is a logic device, and the slave device is a processing device or a memory device.

9. The semiconductor package of claim 1, wherein the first bonding structure comprises a first through-via structure passing through all of the first sub-back-end level layer, the first front-end level layer, and the first semiconductor substrate, and
   wherein the second bonding structure comprises a second through-via structure passing through all of the second front-end level layer and the second semiconductor substrate.

10. The semiconductor package of claim 1, wherein the first semiconductor chip further comprises a through-via structure passing through all of the second sub-back-end level layer, the input and output device level layer, the first sub-back-end level layer, the first front-end level layer, and the first semiconductor substrate,
   wherein the first bonding structure comprises a first internal bump provided on the second sub-back-end level layer and the through-via structure,
   wherein the second bonding structure comprises a second internal bump provided between the second back-end level layer and the first internal bump, and wherein the first internal bump and the second internal bump are bonded to each other.

11. A semiconductor package comprising:

a first semiconductor substrate having a first surface and a second surface opposite to the first surface;

a first front-end level layer provided on the first surface of the first semiconductor substrate and comprising a first integrated circuit device;

a first sub-back-end level layer provided on the first front-end level layer and comprising a plurality of first metal wire layers electrically connected to the first integrated circuit device;

an input and output device level layer provided on the first sub-back-end level layer and comprising a two-dimensional input and output device;

a second sub-back-end level layer provided on the input and output device level layer and comprising a plurality of second metal wire layers electrically connected to the first integrated circuit device and the two-dimensional input and output device;

a first through-via structure passing through all of the first sub-back-end level layer, the first front-end level layer, and the first semiconductor substrate, along a vertical direction from the input and output device level layer toward the first semiconductor substrate;

a second semiconductor substrate having a third surface and a fourth surface opposite to the third surface, wherein the fourth surface is bonded to the second surface of the first semiconductor substrate;

a second front-end level layer provided below the third surface of the second semiconductor substrate and comprising a second integrated circuit device;

a second back-end level layer provided below the second front-end level layer and comprising a plurality of third metal wire layers electrically connected to the second integrated circuit device; and a second through-via structure bonded to the first through-via structure and passing through all of the second back-end level layer, the second front-end level layer, and the second semiconductor substrate along the vertical direction from the second back-end level layer toward the second semiconductor substrate.

12. The semiconductor package of claim 11, wherein the first integrated circuit device comprises a master device, and the second integrated circuit device comprises a slave device.

13. The semiconductor package of claim 11, wherein the two-dimensional input and output device comprises a two-dimensional channel layer comprising a transition metal di-chalcogenide compound or black phosphorus, a gate structure provided on the two-dimensional channel layer, and a source structure and a drain structure, which are provided on the two-dimensional channel layer and respectively on both sides of the gate structure.

14. The semiconductor package of claim 11, wherein the first sub-back-end level layer further comprises first metal vias connecting the plurality of first metal wire layers to each other, and wherein the second sub-back-end level layer further comprises second metal vias connecting the plurality of second metal wire layers to each other.

15. The semiconductor package of claim 11, wherein an upper width of the first through-via structure is less than a lower width of the first through-via structure, and an upper width of the second through-via structure is greater than a lower width of the second through-via structure.

16. The semiconductor package of claim 11, further comprising, on the second back-end level layer, an external bump electrically connected to the plurality of second metal wire layers.

17. A semiconductor package comprising:

a first semiconductor substrate having a first surface and a second surface opposite to the first surface;

a first front-end level layer provided on the first surface of the first semiconductor substrate and comprising a first integrated circuit device;

a first sub-back-end level layer provided on the first front-end level layer and comprising a plurality of first metal wire layers electrically connected to the first integrated circuit device;

an input and output device level layer provided on the first sub-back-end level layer and comprising a two-dimensional input and output device;

a second sub-back-end level layer provided on the input and output device level layer and comprising a plurality of second metal wire layers electrically connected to the first integrated circuit device and the two-dimensional input and output device;

a through-via structure passing through all of the second sub-back-end level layer, the input and output device level layer, the first sub-back-end level layer, the first front-end level layer, and the first semiconductor substrate along a vertical direction from the second sub-back-end level layer toward the first semiconductor substrate;

a first bump level layer provided on the second sub-back-end level layer and the through-via structure and comprising a first internal bump;

a second semiconductor substrate having a third surface and a fourth surface opposite to the third surface;

a second front-end level layer provided below the third surface of the second semiconductor substrate and comprising a second integrated circuit device;

a second back-end level layer provided below the second front-end level layer and comprising a plurality of third metal wire layers electrically connected to the second integrated circuit device; and a second bump level layer provided below the second back-end level layer and comprising a second internal bump electrically connected to the plurality of third metal wire layers, wherein the second internal bump is bonded to the first internal bump.

18. The semiconductor package of claim 17, wherein the first integrated circuit device comprises a master device, and the second integrated circuit device comprises a slave device.

19. The semiconductor package of claim 17, wherein the two-dimensional input and output device comprises a two-dimensional channel layer comprising a transition metal di-chalcogenide compound or black phosphorus, a gate structure provided on the two-dimensional channel layer, and a source structure and a drain structure, which are provided on the two-dimensional channel layer and respectively on both sides of the gate structure.

20. The semiconductor package of claim 17, further comprising a wire level layer below the first semiconductor substrate, wherein an external bump electrically connected to the through-via structure is further provided below the wire level layer.

* * * * *